United States Patent
Tangring et al.

(10) Patent No.: US 11,404,611 B2
(45) Date of Patent: Aug. 2, 2022

(54) PRODUCTION OF A SEMICONDUCTOR DEVICE

(71) Applicant: OSRAM Opto Semiconductors GmbH, Regensburg (DE)

(72) Inventors: Ivar Tangring, Regensburg (DE); Gregory Bellynck, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 95 days.

(21) Appl. No.: 16/640,033

(22) PCT Filed: Aug. 16, 2018

(86) PCT No.: PCT/EP2018/072239
§ 371 (c)(1),
(2) Date: Feb. 18, 2020

(87) PCT Pub. No.: WO2019/034737
PCT Pub. Date: Feb. 21, 2019

(65) Prior Publication Data
US 2020/0251624 A1   Aug. 6, 2020

(30) Foreign Application Priority Data
Aug. 18, 2017  (DE) .......................... 102017118915.7

(51) Int. Cl.
*H01L 33/50* (2010.01)
*H01L 33/56* (2010.01)

(52) U.S. Cl.
CPC ............ *H01L 33/504* (2013.01); *H01L 33/56* (2013.01); *H01L 2933/005* (2013.01)

(58) Field of Classification Search
None
See application file for complete search history.

(56) References Cited

U.S. PATENT DOCUMENTS

| | | | |
|---|---|---|---|
| 10,115,871 B2 | 10/2018 | Linkov et al. | |
| 2008/0218072 A1* | 9/2008 | Haruna | H01L 33/54 313/506 |

(Continued)

FOREIGN PATENT DOCUMENTS

| | | |
|---|---|---|
| DE | 102015101143 A1 | 7/2016 |
| DE | 102015109324 A1 | 12/2016 |
| JP | 2009295892 A | 12/2009 |

*Primary Examiner* — Sarah K Salerno
(74) *Attorney, Agent, or Firm* — Slater Matsil, LLP

(57) ABSTRACT

In an embodiment a method for producing a semiconductor device includes providing a carrier with a semiconductor component arranged on the carrier, providing a layer arrangement on the carrier, the layer arrangement adjoining the semiconductor component and comprising a first and a second flowable layer, wherein the first layer is formed on the carrier and then the second layer is formed on the first layer, wherein the first layer comprises particles, wherein a density of the first layer is greater than a density of the second layer, and wherein a lateral wetting of the semiconductor component with the first layer occurs such that the first layer comprises a first configuration comprising a curved layer surface laterally with respect to the semiconductor component, and centrifuging the carrier such that the first layer comprises a second configuration as a result, wherein the first layer cannot return to the first configuration since the second layer is arranged on the first layer.

17 Claims, 19 Drawing Sheets

(56) References Cited

U.S. PATENT DOCUMENTS

2015/0028361 A1    1/2015  Schlereth et al.
2020/0044126 A1*  2/2020  Tangring ............... H01L 33/486

* cited by examiner

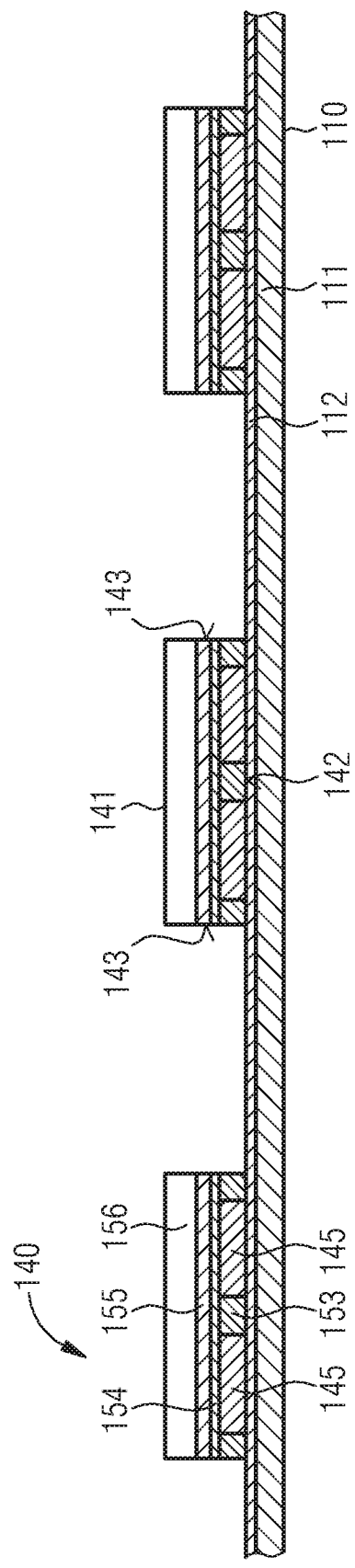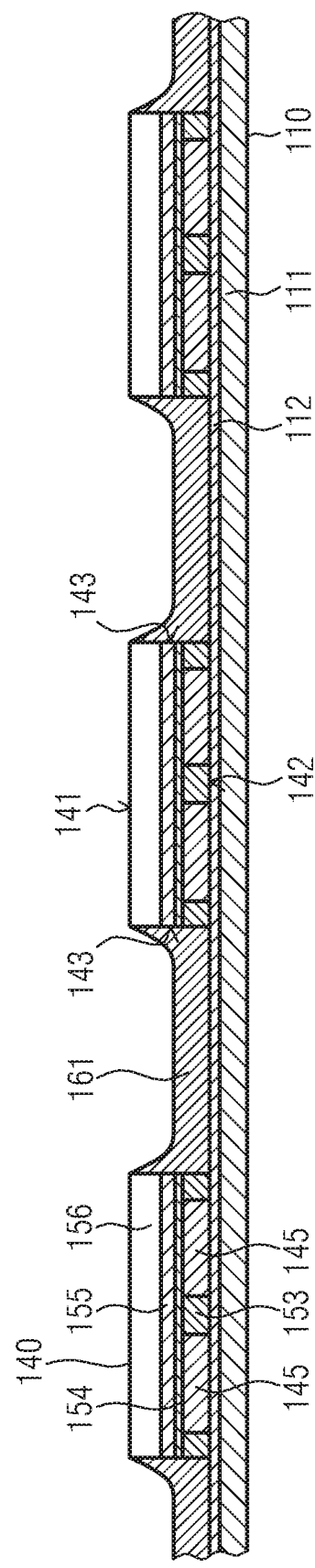

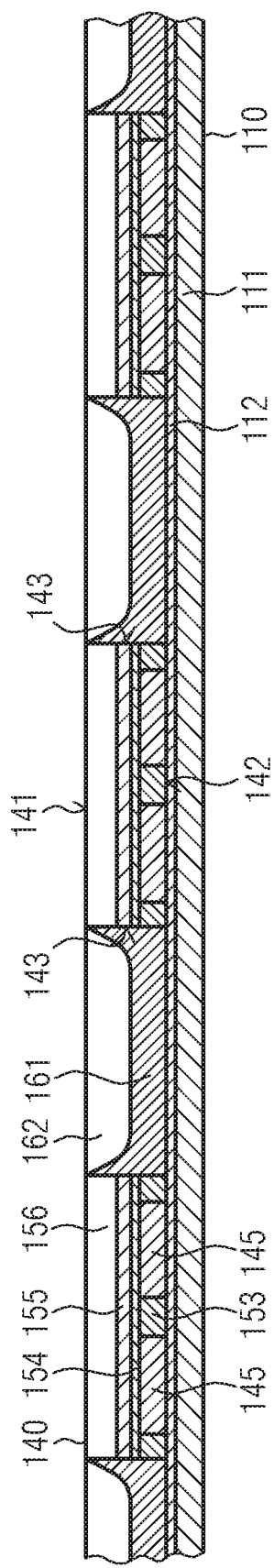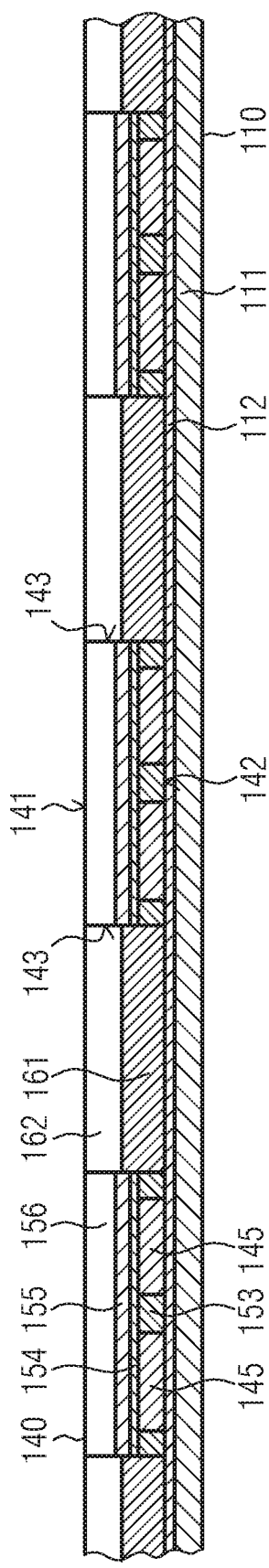

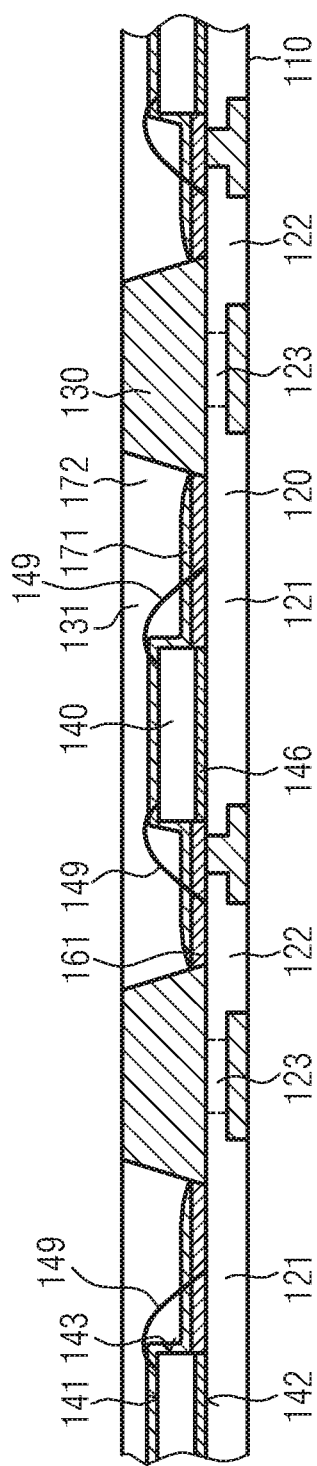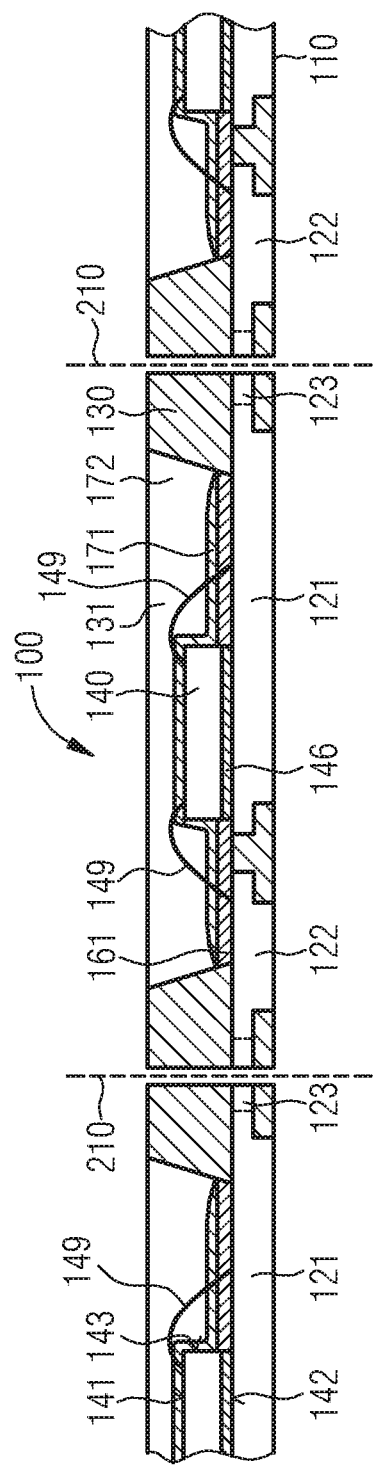

PRODUCTION OF A SEMICONDUCTOR DEVICE

This patent application is a national phase filing under section 371 of PCT/EP2018/072239, filed Aug. 16, 2018, which claims the priority of German patent application 102017118915.7, filed Aug. 18, 2017, each of which is incorporated herein by reference in its entirety.

TECHNICAL FIELD

The present invention relates to a method for producing a semiconductor device. The invention furthermore relates to a semiconductor device.

BACKGROUND

The production of a semiconductor device may comprise providing a carrier and arranging a semiconductor component on the carrier. The semiconductor component may be a radiation-emitting semiconductor component configured for emitting radiation via a front side and via lateral sidewalls. In this context, consideration may furthermore be given to forming a thin white reflective layer laterally with respect to the semiconductor component. For this purpose, a plastics layer comprising embedded reflective particles in a flowable state may be applied laterally with respect to the semiconductor component on the carrier, which plastics layer may subsequently cure. A lateral wetting of the semiconductor component with the plastics layer comprising particles may occur during application. In this way, the plastics layer may constitute an undesired barrier preventing radiation from being coupled out laterally via the sidewalls of the semiconductor component.

SUMMARY OF THE INVENTION

Embodiments provide an improved method for producing a semiconductor device and an improved semiconductor device.

In accordance with one embodiment of the invention, a method for producing a semiconductor device is proposed. The method comprises providing a carrier with a semiconductor component arranged on the carrier. A further step is providing a layer arrangement on the carrier, the layer arrangement adjoining the semiconductor component and comprising a first and a second flowable layer. The first layer is formed on the carrier. The second layer is then formed on the first layer. The first layer comprises particles. A density of the first layer is greater than a density of the second layer. In the course of forming the first layer, a lateral wetting of the semiconductor component with the first layer occurs, such that the first layer comprises a first configuration comprising a curved layer surface laterally with respect to the semiconductor component. The method furthermore comprises centrifuging the carrier provided with the semiconductor component and the layer arrangement, such that the curvature of the layer surface of the first layer laterally with respect to the semiconductor component is at least reduced and the first layer comprises a second configuration as a result. With the aid of the second layer arranged on the first layer, it is suppressed that the first layer returns again to the first configuration.

Applying the flowable first layer comprising particles on the carrier is associated with a lateral wetting of the semiconductor component. In this way, lateral sidewalls of the semiconductor component may be covered with the first layer. A first configuration of the first layer is thus present, in which the first layer comprises a curved layer surface in cross section laterally with respect to the semiconductor component under the influence of the surface tension and the wetting properties. The layer surface may be concavely curved. Furthermore, the first layer, laterally with respect to the semiconductor component, may comprise a nonuniform layer thickness profile comprising a layer thickness that rises in the direction of the semiconductor component.

In order to alter this configuration, the flowable second layer is formed directly on the flowable first layer, the density of the second layer being less than the density of the first layer. Furthermore, the carrier provided with the semiconductor component and the layer arrangement is centrifuged. During this process, which is carried out in a flowable state of the two layers, the layer arrangement is pressed in the direction of the carrier under the influence of the centrifugal force.

The principle of the density separation of fluids is utilized during the centrifuging. In this case, the greater density of the first layer has the effect that intermixing of the two layers is avoided or largely suppressed, and the layers may therefore be present as individual layers after the centrifuging as well. The pressing of the heavier first layer in the direction of the carrier on account of the centrifugal force furthermore has the consequence that the curvature of the layer surface of the first layer laterally with respect to the semiconductor component is at least reduced. In this way, the lateral covering of the semiconductor component with the first layer may be at least reduced, and the layer thickness profile of the first layer may be more uniform.

With the aid of the centrifuging, a second configuration of the first layer is consequently brought about, in which the first layer comprises an at least less curved layer surface in cross section laterally with respect to the semiconductor component. It is also possible for the curvature to be eliminated and for the first layer to comprise a planar layer surface laterally with respect to the semiconductor component. In this way, the first layer may comprise a uniform layer thickness profile.

After the centrifuging, the two layers are (still) in a flowable state. In this case, the second layer arranged on the first layer ensures that a reversion of the first layer to the first, that is to say curved or more greatly curved, configuration is suppressed. This is because, with the aid of the second layer, the surface tension of the first layer may be counteracted or, to put it another way, the surface tension of the first layer may be neutralized. It is therefore possible for the second, that is to say less curved or planar, configuration of the first layer to be maintained.

A more detailed description is given below of further possible details and embodiments which may be considered for the method and for the semiconductor device produced in accordance with the method.

The semiconductor device may be realized in a QFN design (Quad Flat No Leads) and may be suitable for surface mounting (SMT, Surface Mounting Technology).

The layer arrangement may be provided in a manner laterally adjoining the semiconductor component. In this case, the semiconductor component may be enclosed laterally by the layer arrangement. A front side of the semiconductor component may be left uncovered.

In a further embodiment, the first layer is a plastics layer. In this case, the first layer comprises, besides the particles, a plastics material such as a silicone material, for example. The first layer may be in this respect a plastics or silicone layer comprising particles.

In a further embodiment, the second layer is a plastics layer. It is furthermore possible for both the first layer and the second layer to be a plastics layer.

For forming the first and second layers, in each case, for example, metering a corresponding flowable material or plastics material may be carried out with the aid of a dispenser (dispensing).

Forming the first layer may be carried out in such a way that the first layer in the first configuration extends as far as or approximately as far as a front side of the semiconductor component. In this case, the semiconductor component may be laterally enclosed by the first layer. Depending on the design of the semiconductor component and on the arrangement thereof on the carrier, the first layer may also partly adjoin a rear side of the semiconductor component or be located in a region between the rear side of the semiconductor component and the carrier.

After the centrifuging, the semiconductor component may project relative to the first layer. In the second configuration of the first layer present here, lateral sidewalls of the semiconductor component may be partly covered with the first layer. A further part of the sidewalls may be covered with the second layer. It is also possible for the sidewalls to be covered only slightly or not to be covered with the first layer. In this configuration, the sidewalls may be covered at least partly with the second layer. Moreover, the first layer, depending on the design of the semiconductor component, may adjoin, for example, one or a plurality of rear-side contacts and a rear side, or a rear-side metallization of the semiconductor component.

Forming the second layer may be carried out in such a way that the second layer likewise extends as far as or approximately as far as a front side of the semiconductor component. In this case, the second layer may terminate flush with the front side of the semiconductor component. After the centrifuging, the second layer, in contrast to the first layer, may still extend as far as or approximately as far as the front side of the semiconductor component or else terminate flush with the front side of the semiconductor component.

After the centrifuging, curing the layer arrangement comprising the two layers may be carried out. In this case, the first and second layers may be cured jointly. It is furthermore possible to form at least one further layer before the curing. As a result, it is possible to alter the configuration of the layer arrangement. Furthermore, consideration may be given to curing only the first layer. Possible embodiments in this respect will be discussed in even greater detail further below.

Curing one or a plurality of layers may be carried out with the aid of a heating process, for example. Depending on layer material used, curing may also be carried out, for example, by irradiation with UV radiation (ultraviolet radiation).

The second layer may be a particle-free layer comprising no embedded particles, in contrast to the first layer. The difference in density between the first and second layers may stem from the particle-comprising configuration of the first layer.

The semiconductor device produced with the aid of the method may be a radiation-emitting semiconductor device. In such an embodiment, the semiconductor component which is used and arranged on the carrier is a radiation-emitting semiconductor component. The semiconductor component may be configured for emitting radiation via a front side and via lateral sidewalls.

As has been described above, with the aid of the method, an initial covering of sidewalls of the semiconductor component with the first layer (first configuration of the first layer) may be at least reduced (second configuration of the first layer). In this way, it is possible to avoid a situation in which the first layer constitutes an optical barrier preventing radiation from being coupled out laterally via the sidewalls of the semiconductor component.

In a further embodiment, the second layer is a radiation-transmissive plastics layer. The second layer may be a clear plastics layer, for example. This makes it possible to avoid a situation in which the second layer constitutes an optical barrier.

In a further embodiment, the semiconductor component is a radiation-emitting semiconductor chip. The semiconductor chip may comprise components such as a semiconductor layer sequence comprising an active zone for generating radiation, contacts and optionally a chip substrate. Via the contacts, the semiconductor chip may be supplied with electrical energy. The semiconductor chip may furthermore be a light emitting diode chip (LED chip), for example.

In regard to the above-explained emission of radiation via a front side and via lateral sidewalls, the semiconductor chip may be a volume emitting semiconductor chip. Furthermore, the semiconductor chip may be realized in the form of a flip-chip comprising only rear-side contacts. This may be a volume emitting sapphire flip-chip comprising a chip substrate comprising sapphire. Other designs are also possible, for example, a configuration of the semiconductor chip comprising only front-side contacts. In this case, the semiconductor chip may be a volume emitting sapphire chip comprising a chip substrate comprising sapphire. Furthermore, the semiconductor chip may comprise a rear-side metallic base. The base may be used as a reflector and for thermally linking the semiconductor chip. Furthermore, coupling out radiation laterally may be promoted with the aid of the base.

In a further embodiment, the semiconductor component is a radiation-emitting CSP semiconductor component (Chip Size Package). Such a semiconductor component may comprise a radiation-emitting semiconductor chip and a size of the order of magnitude of the semiconductor chip. With regard to the semiconductor chip, details mentioned above, for example, a configuration as a flip-chip, may be applicable.

Besides the semiconductor chip, the CSP semiconductor component may comprise at least one further constituent. This may encompass, for example, a conversion layer for radiation conversion covering the semiconductor chip or the semiconductor layer sequence thereof. A further possible constituent is a radiation-transmissive layer or covering comprising a glass material, for example. In this configuration of the CSP semiconductor component, a conversion layer for radiation conversion may be arranged between the radiation-transmissive covering and the semiconductor chip or the semiconductor layer sequence thereof.

With regard to the first layer comprising particles, besides the abovementioned embodiment as a plastics layer, a variety of further configurations may be considered. The particles may comprise, for example, a particle size or a diameter in the region of 200 nm.

In a further embodiment, the first layer comprises reflective particles. In this configuration, the first layer may comprise a white color and serve as a reflector layer of the semiconductor device produced with the aid of the method. The reflective particles may be $TiO_2$ particles, for example.

In a further embodiment, the first layer comprises absorbent particles. A high contrast may be achieved in this way. On account of the absorbent particles, the first layer may comprise a black color. The absorbent particles may be carbon black particles, for example.

In a further embodiment, the first layer comprises phosphor particles. A radiation conversion may be effected with the aid of the phosphor particles. In this way, the first layer may serve as a conversion layer of the semiconductor device produced.

The method may be carried out reliably if there is a relatively large difference in density between the first and second layers. One example is a difference in density in which the density of the first layer is at least 50% greater than the density of the second layer.

Such a manifestation may be realized in accordance with a further embodiment by virtue of the fact that the first layer comprises particles with a proportion by weight in a range of 30% to 50%. By way of example, a proportion by weight of 40% or 45% is possible. These indications may apply to a configuration of the first layer comprising reflective particles such as $TiO_2$ particles, for example.

Besides the particles mentioned above, the first layer may additionally comprise at least one filler. The following embodiments are conceivable in this context.

Consideration may be given, for example, to providing further particles in the first layer in order to provide a suitable difference in density between the two layers. The further particles, which may be employed as a weight- and thus density-increasing filler in the first layer, may be, for example, particles comprising a quartz material or a glass material. A configuration comprising further particles may be considered, for example, if the first layer comprises carbon black particles.

A further possible filler which the first layer may comprise is glass fibers, for example. The latter, too, may serve as a weight- and thus density-increasing filler in the first layer.

In the case of a configuration of the first and second layers as plastics layers, the reliability of the method may be promoted in accordance with a further embodiment by virtue of the fact that the first and second layers comprise a corresponding plastics material. By way of example, a good adhesion of the second layer on the first layer may be brought about in this way.

Alternatively, the first and second layers may comprise different plastics materials.

In a further embodiment, the first and second layers comprise a silicone material. Such a material may be distinguished by a high resistance to radiation, for example, vis-à-vis a UV radiation or a blue light radiation. With the use of a radiation-emitting semiconductor component, such a light radiation may be emitted at least in part by the semiconductor component. The first and second layers may comprise the same silicone material, or different silicone materials.

It is possible for the carrier used in the method to be a temporary carrier used only for auxiliary purposes in the production method. In this sense, in accordance with a further embodiment, provision is made for removing the carrier to be carried out after the centrifuging and optionally at least one further method step.

The abovementioned embodiment may be realized, for example, by the carrier comprising an adhesive film on a main side, the adhesive property of which may subsequently be eliminated or at least reduced, for example, by action of temperature or irradiation with UV radiation, for example. The semiconductor component and the layer arrangement may be arranged on the adhesive film of the carrier. After the centrifuging, the adhesive effect of the adhesive film may be eliminated or reduced, thereby enabling the carrier including the adhesive film to be removed in a simple manner.

It is possible for the second layer used in the method to serve as a sacrificial layer or sacrificial liquid. The following embodiments may be used in this context.

In a further embodiment, after the centrifuging, curing the first layer and then removing the second layer are carried out. Removing the second layer may be carried out, for example, by using a solvent. Evaporating the second layer by carrying out a heating process is also possible.

The procedure mentioned above may be promoted in accordance with a further embodiment by virtue of the fact that only the first layer is cured during the process of curing the first layer. To put it another way, this means that during the process of curing the first layer, no influencing or impairment of the second layer in the form of, for example, curing or removing or partly removing the second layer occurs and, consequently, the second layer may still be present unchanged as a flowable layer after the process of curing the first layer. In this way, it is possible to ensure that the first layer maintains the second, that is to say less curved or planar, configuration during the curing. Furthermore, the second layer may subsequently be removed reliably, without the risk of the cured first layer being removed or damaged. The following further embodiments may be used in this context.

It is possible, for example, to carry out the process of curing the first layer with the aid of a heating process. For this purpose, the second layer may correspondingly comprise a layer material which withstands the curing temperature used during the process of curing the first layer, such that curing or evaporation of the second layer is avoided in this step. Only then may the second layer be evaporated with the use of a higher temperature or removed with the aid of a solvent.

It is also conceivable to carry out the process of curing the first layer by means of irradiation with UV radiation. For this purpose, the second layer may correspondingly comprise a layer material which is not influenced by the UV radiation used, such that curing of the second layer is avoided in this step. Only then may the second layer be evaporated by carrying out a heating process or be removed with the aid of a solvent.

Various flowable materials may be considered for the second layer serving as a sacrificial layer. The materials may also be liquids. The second layer may comprise, for example, silicone oil, glycerol or water, or else a plurality of the aforementioned materials.

If, as indicated above, a temporary carrier is used during the method, removing the carrier may be carried out after removing the second layer serving as a sacrificial layer and optionally at least one further method step.

In a further embodiment, the carrier provided comprises a cavity, in which the semiconductor component is arranged. The layer arrangement may be formed in the cavity in a corresponding manner. In this configuration, the carrier may be, for example, a leadframe-based carrier comprising a metallic leadframe and a plastics body partly surrounding the leadframe. The cavity or a circumferential inner wall of the cavity may be constituted with the aid of the plastics body. The cavity may comprise in cross section a shape that widens in the direction of a front side of the plastics body, such that the cavity may serve as a reflector.

In a further embodiment, a wall structure enclosing a cavity is arranged on the carrier provided. In this case, the semiconductor component is arranged in the cavity on the carrier. The layer arrangement may be formed in the cavity in a corresponding manner. In this embodiment, the above-explained process of removing the carrier may be employed. Furthermore, the cavity may comprise in cross section a shape that widens in the direction of a front side of the wall structure, such that the cavity may serve as a reflector.

In regard to the embodiments mentioned above, the relevant cavity may be relatively narrow. Furthermore, a lateral wetting with the first layer may occur not only at the semiconductor component but also at a circumferential inner wall of the cavity. Even under such conditions, the method affords the possibility of achieving a (more) planar manifestation of the first layer.

After the centrifuging, at least one further method step may be carried out. In a further possible embodiment, forming a further layer is carried out. The further layer may be a flowable layer or plastics layer. The further layer may be formed on the semiconductor component and/or on the second layer (provided that the second layer does not serve as a sacrificial layer with the latter being removed). The further layer may be a conversion layer, for example. For this purpose, a plastics material comprising phosphor particles may be applied on the semiconductor component and/or on the second layer. The applying may be carried out in a state in which the first and second layers have not yet cured.

Optionally, sedimenting the phosphor particles may subsequently take place. In this way, a sedimented conversion layer may be constituted on the semiconductor component and/or on the first layer. Owing to the sedimenting, a further layer arranged on the sedimented conversion layer may be constituted, which may be radiation-transmissive or clear. In such an embodiment of the method, the original layer arrangement comprising the first and second layers may no longer be present, rather a layer arrangement comprising the first layer, the sedimented conversion layer and the further layer may be present.

If the second layer, as indicated above, serves as a sacrificial layer that is removed after the first layer has been cured, forming a further layer may also be carried out after removing the second layer and thus on the cured first layer or on the semiconductor component and on the cured first layer. In this configuration, the further layer may correspondingly be a conversion layer which may be formed by applying a plastics material comprising phosphor particles. Optionally, sedimenting the phosphor particles may subsequently take place. A sedimented conversion layer may be constituted in this way. Owing to the sedimenting, a further layer arranged on the sedimented conversion layer may be constituted, which may be radiation-transmissive or clear.

In a further embodiment, after the centrifuging, a lens is formed. For this purpose, a radiation-transmissive or clear plastics material may be applied, which comprises a lens structure. The plastics material may optionally be the same material from which the second layer may be formed.

With the aid of the method, it is possible to produce not only one semiconductor device but also a plurality of semiconductor devices jointly in an assemblage. Features and details mentioned above may be corresponding applicable with regard to the production of the plurality of semiconductor devices. The following embodiments are furthermore conceivable in this context.

In a further embodiment, the carrier is provided with a plurality of semiconductor components arranged on the carrier. Moreover, the layer arrangement is provided in a manner adjoining the semiconductor components. In this case, the first layer in the first configuration may laterally wet all semiconductor components and, as a result, comprise in each case a curved layer surface and a nonuniform layer thickness profile in cross section laterally with respect to the semiconductor components. As a result of the centrifuging, the curvature of the layer surface of the first layer laterally with respect to the semiconductor components and the lateral covering of the semiconductor components may be at least reduced, and the layer thickness profile of the first layer may be made more uniform. In this way, the first layer may comprise the second, that is to say less curved or planar, configuration. A reversion of the first layer to the first configuration may be suppressed with the aid of the second layer arranged on the first layer. After the centrifuging, removing the carrier may furthermore be carried out, as was explained above.

In a further embodiment, the carrier is provided with a plurality of semiconductor components arranged on the carrier. Moreover, a plurality of separate layer arrangements adjoining semiconductor components are provided on the carrier, the layer arrangements each comprising the first and second layers. In this embodiment, the carrier may comprise a plurality of cavities, in which the semiconductor components are arranged and in which the layer arrangements may be formed. In this context, details mentioned above may be applied, such as a configuration of the carrier as a leadframe-based carrier, for example. It is also conceivable to use a wall structure arranged on the carrier, as was described above. In this case, the wall structure comprises a plurality of cavities, in which the semiconductor components are arranged and in which the layer arrangements may be formed. The wall structure may comprise a lattice shape, as seen in plan view.

In the first configuration the first layers of the layer arrangements may laterally wet the associated semiconductor components and, as a result, comprise in each case a curved layer surface and a nonuniform layer thickness profile in cross section laterally with respect to the semiconductor components. As a result of the centrifuging, the curvatures of the layer surfaces of the first layers laterally with respect to the semiconductor components and the lateral covering of the semiconductor components may be at least reduced, and the layer thickness profiles of the first layers may be made more uniform. As a result, the first layers of the layer arrangements may comprise the second, that is to say less curved or planar, configuration. A reversion of the first layers to the first configuration may be suppressed by the second layers arranged on the first layers.

In regard to producing a plurality of semiconductor devices, further details from among those explained above may be applied. It is possible, for example, to produce radiation-emitting semiconductor devices by using radiation-emitting semiconductor components. Furthermore, the second layer(s) may be formed in a manner free of particles and/or as radiation-transmissive. After the centrifuging, at least one further process may be carried out, for example, forming one further layer or a plurality of separate further layers. It is furthermore possible to remove the second layer(s), after a process of curing the first layer(s). Moreover, each of the semiconductor devices may be produced with a lens. For this purpose, a radiation-transmissive or clear plastics material may be applied, which comprises a lens structure. The lens structure may comprise a plurality of lenses arranged next to one another.

In a further embodiment, after the centrifuging, singulating is carried out. In this way, a plurality of semiconductor devices produced jointly may be separated from one another. The singulating may be carried out by means of sawing, for example. During the singulating, depending on the configuration, individual or a plurality of the components mentioned above such as, for example, the layer arrangement or the first layer, the carrier, the wall structure and/or at least one further constituent such as a further layer, for example, may be severed. If a temporary carrier is used, the singulating may be carried out on the carrier without the latter being damaged, and the carrier may be removed after the singulating.

Besides the abovementioned carriers such as, for example, a leadframe-based carrier or a temporary carrier, the method may be carried out with further carriers. By way of example, it is possible to use a ceramic carrier or a metal core printed circuit board (MCPCB).

In accordance with a further embodiment of the invention, a semiconductor device is proposed. The semiconductor device comprises a semiconductor component and a layer arrangement adjoining the semiconductor component. The layer arrangement comprises a first layer and a second layer arranged on the first layer. The first and second layers are plastics layers. The first layer comprises particles. Furthermore, the first layer comprises a planar layer surface laterally with respect to the semiconductor component.

In the case of the semiconductor device, the planar layer surface of the first layer, which may be present laterally and thus also in a region adjoining the semiconductor component, may be formed by centrifuging. The centrifuging may be carried out in a flowable state of the first layer. In the case of the semiconductor device, the first layer, and also the second layer, may be cured.

The semiconductor device may be produced in accordance with the method explained above or in accordance with one or more of the above-described embodiments of the method. For the semiconductor device, embodiments the same as those explained above are conceivable and advantages the same as those explained above may be taken into consideration. By way of example, sidewalls of the semiconductor component may be covered at most partly with the first layer. The second layer with which the sidewalls may be at least partly covered may be radiation-transmissive.

Furthermore, the semiconductor device may be a radiation-emitting semiconductor device. In this embodiment, the semiconductor component is a radiation-emitting semiconductor component. The semiconductor component may be configured for emitting radiation via the sidewalls and via a front side. The configuration mentioned above affords the possibility of radiation being coupled out in an unimpeded manner via the sidewalls of the semiconductor component.

With regard to the semiconductor device, individual or a plurality of the embodiments mentioned below may furthermore be present. The second layer may be arranged directly on the first layer. The semiconductor component may project relative to the first layer. A density of the first layer may be greater than a density of the second layer. The semiconductor component may be enclosed laterally or circumferentially by the layer arrangement comprising the first and second layers. Optionally, the semiconductor component may also be covered on the front side. The first layer may comprise reflective particles, absorbent particles and/or phosphor particles. The first and second layers may comprise a corresponding plastics material. The first and second layers may comprise a silicone material. The semiconductor device may comprise a carrier, on which the semiconductor component and the layer arrangement are arranged. The carrier may comprise a cavity, in which the semiconductor component and the layer arrangement are arranged. In this case, the carrier may be a leadframe-based carrier. The semiconductor component may furthermore comprise a wall structure enclosing a cavity. The wall structure may comprise a frame shape. The semiconductor component and the layer arrangement may be arranged in the cavity of the wall structure. The semiconductor device may comprise a further layer. The further layer may be arranged on the semiconductor component and/or on the second layer. The further layer may be a conversion layer for radiation conversion. Furthermore, the semiconductor device may comprise a lens.

In a further embodiment, the first and second layers comprise different plastics materials. The latter may be different silicone materials. The second layer may be arranged directly on the first layer.

In a further embodiment, the semiconductor component is enclosed circumferentially by the layer arrangement comprising the first and second layers. Furthermore, a front side of the semiconductor component is not covered with the layer arrangement comprising the first and second layers. In this case, it is possible for the front side of the semiconductor component to be covered with a further layer.

The advantageous configurations and developments of embodiments of the invention that have been explained above and/or are reproduced in the dependent claims may be used individually or else in any combination with one another—apart from, for example, in cases of clear dependencies or incompatible alternatives.

BRIEF DESCRIPTION OF THE DRAWINGS

The above-described properties, features and advantages of this invention and the way in which they are achieved will become clearer and more clearly understood in association with the following description of exemplary embodiments which are explained in greater detail in association with the schematic drawings, in which:

FIGS. 25 to 30 show a further method sequence for producing semiconductor devices, wherein a temporary carrier with CSP semiconductor components is provided, a layer arrangement adjoining the semiconductor components and comprising a first and a second plastics layer is provided on the carrier, centrifuging is carried out, lenses are formed, and singulating and removing the carrier are carried out;

FIGS. 37 to 42 show a further method sequence for producing semiconductor devices, wherein a leadframe-based carrier comprising cavities and semiconductor chips located within the cavities is provided, layer arrangements adjoining the semiconductor chips and comprising a first and a second layer are provided in the cavities, centrifuging is carried out, the first layers are cured, the second layers are removed, sedimented conversion layers are formed in the cavities, and singulating is carried out.

Possible configurations of radiation-emitting semiconductor devices and of associated production methods are described with reference to the following schematic figures. In the context of production, processes known from semiconductor technology and from the fabrication of optoelectronic semiconductor devices may be carried out and customary materials in these fields may be used, such that they will be discussed only in part. In the same way, in addition to processes shown and described, further processes may be carried out, and the semiconductor devices may comprise further components and structures in addition to components and structures shown and described. It is furthermore pointed out that the figures are merely of schematic nature and are not true to scale. In this sense, components and structures shown in the figures may be illustrated with exaggerated size or size reduction in order to afford a better understanding.

DETAILED DESCRIPTION OF ILLUSTRATIVE EMBODIMENTS

Figure 1:
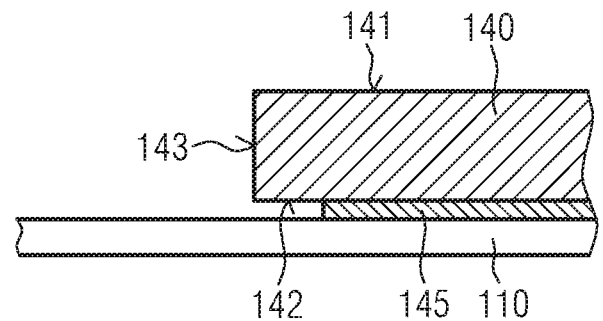
FIGS. 1 to 5 show a method sequence for producing a semiconductor device, wherein a carrier with a semiconductor component is provided, a layer arrangement adjoining the semiconductor component and comprising a first plastics layer comprising a curved layer surface and a second plastics layer is provided on the carrier, and centrifuging is carried out in order to at least reduce the curvature of the layer surface.

FIGS. 1 to 5 show in an excerpt, on the basis of lateral sectional illustrations, a method for producing a radiation-emitting semiconductor device 100. In the method, as is shown in FIG. 1, a carrier 110 with a radiation-emitting semiconductor component 140 arranged thereon is provided. It is possible for the carrier 110 to comprise a cavity or for a delimiting structure, within which the semiconductor component 140 is arranged (not illustrated), to be located on the carrier 110. A delimited region for subsequent material application may be defined in this way.

The semiconductor component 140 comprises a front side 141, an opposite rear side 142 relative to the front side 141, and a lateral sidewall 143. Besides the sidewall 143 shown in the excerpt in FIG. 1, the semiconductor component 140 may comprise further sidewalls 143. The semiconductor component 140 may comprise a parallelepipedal shape and, as a result, a total of four sidewalls 143 (not illustrated). The semiconductor component 140 may be configured for emitting electromagnetic radiation via the front side 141 and via the sidewalls 143.

As is shown in FIG. 1, the semiconductor component 140 comprises a rear-side metallic contact 145. By way of the contact 145, the semiconductor component 140 is arranged on the carrier 110. The contact 145 constitutes a part of the rear side 142 of the semiconductor component 140, such that an interspace is present partly between the rear side 142 and the carrier 110. The contact 145 may be realized in the form of a connection pad (bond pad) comprising a metallization.

Besides the contact 145 shown in FIG. 1, the semiconductor component 140 may comprise a further rear-side contact 145. In this configuration, the semiconductor component 140 may be, for example, an LED chip in the form of a volume emitting flip-chip, and, in addition to the contact 145, may comprise constituents such as a semiconductor layer sequence comprising an active zone for generating radiation and a radiation-transmissive chip substrate (not illustrated in each case). Via the contacts 145, the semiconductor component 140 may be supplied with electrical energy. The semiconductor component 140 may be a sapphire flip-chip comprising a chip substrate comprising sapphire.

Figure 2:
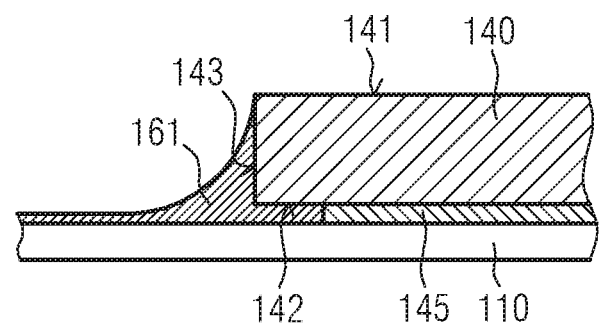

The method subsequently involves carrying out a process of providing a layer arrangement on the carrier 110, the layer arrangement adjoining the semiconductor component 140 and laterally enclosing the semiconductor component 140 and comprising a first and a second flowable layer 161, 162. The latter in the present case are plastics layers, which are therefore also referred to hereinafter as first plastics layer 161 and second plastics layer 162. As is shown in FIG. 2, firstly the flowable first plastics layer 161 is formed on the carrier 110 laterally with respect to the semiconductor component 140. A lateral wetting of the semiconductor component 140 with the first plastics layer 161 takes place during this process. A first configuration of the first plastics layer 161 is therefore present, in which the plastics layer 161, under the influence of the surface tension and the wetting properties, comprises a concavely curved layer surface in cross section laterally with respect to the semiconductor component 140 and, as a result, a nonuniform layer thickness profile comprising a layer thickness that rises in the direction of the semiconductor component 140. In this configuration, the semiconductor component 140 and thus the sidewalls 143 thereof are laterally enclosed by the plastics layer 161.

As is illustrated in FIG. 2, the first plastics layer 161 may extend as far as the front side 141 of the semiconductor component 140. By contrast, the front side 141 remains uncovered. In the illustrated design of the semiconductor component 140, the plastics layer 161 also partly adjoins the rear side 142 of the semiconductor component 140 and the rear-side contact(s) 145, and is located in the interspace between the rear side 142 of the semiconductor component 140 and the carrier 110.

Figure 6:
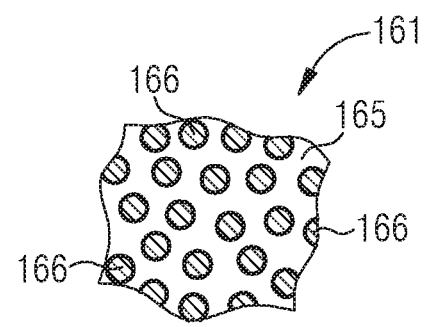
FIG. 6 shows an enlarged illustration of the first plastics layer comprising a plastics material and particles.

The first plastics layer 161 is a plastics layer comprising particles. With reference to FIG. 6, which shows an enlarged illustration of the first plastics layer 161 in an excerpt, it becomes clear that the plastics layer 161 comprises a plastics material 165 and particles 166 embedded therein. The plastics material 165 may be a silicone material. The particles 166 may be reflective particles such as $TiO_2$ particles, for example. In this way, the first plastics layer 161 may be a reflective silicone layer comprising a white color and may serve as a reflector layer in the produced semiconductor device 100.

The particles 166 may comprise a particle size or a diameter in the region of 200 nm. Furthermore, the proportion by weight of the particles 166 in the first plastics layer 161 may be in a range of 30% to 50%. By way of example, a proportion by weight of 40% or 45% is possible.

Figure 3:
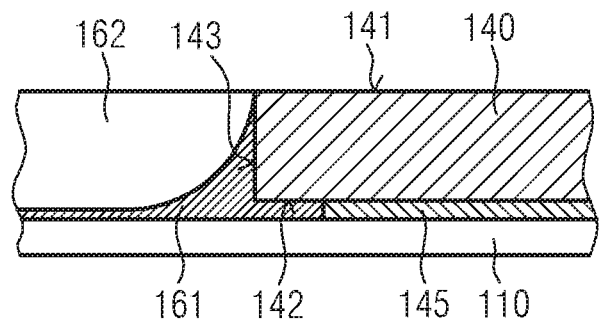

Providing the layer arrangement furthermore comprises subsequently forming the flowable second plastics layer 162 on the first plastics layer 161, which has not yet been cured and, as a result, is wet and flowable, laterally with respect to the semiconductor component 140, as is illustrated in FIG. 3. The second plastics layer 162 may be formed in such a way that the second plastics layer 162 also extends as far as the uncovered front side 141 of the semiconductor component 140. The second plastics layer 162 and thus the layer arrangement comprising the two plastics layers 161, 162 may terminate flush with the front side 141 of the semiconductor component 140. In this way, a planarization may be achieved, and the layer arrangement may be present in the form of a planar potting.

The second plastics layer 162 is a particle-free plastics layer comprising only a radiation-transmissive or clear plastics material. The latter may be the plastics or silicone material 165 which the first plastics layer 161 also comprises.

Forming the plastics layers 161, 162 may be carried out in each case by applying the associated flowable plastics material laterally with respect to the semiconductor component 140 with the aid of a dispenser (not illustrated).

The particle-comprising configuration of the first plastics layer 161 in comparison with the particle-free configuration of the second plastics layer 162 has the consequence that the density of the first plastics layer 161 is greater than the density of the second plastics layer 162. In the case of the above-described configuration of the first plastics layer 161 comprising silicone comprising a proportion by weight of reflective $TiO_2$ particles of 40%, the first plastics layer 161 may comprise a density of 1.6 $g/cm^3$. The second plastics layer 162 formed from clear silicone may comprise a lower density of 1.15 $g/cm^3$.

In the state shown in FIG. 3 with the curved first configuration of the first plastics layer 161, the plastics layer 161 constitutes an optical barrier preventing radiation from being coupled out laterally via the sidewalls 143 of the semiconductor component 140. Operation of the semiconductor component 140 in this state is associated with losses of efficiency. The method is therefore an aid in endeavoring to at least reduce the lateral wetting of the semiconductor component 140 with the plastics layer 161.

Figure 4:
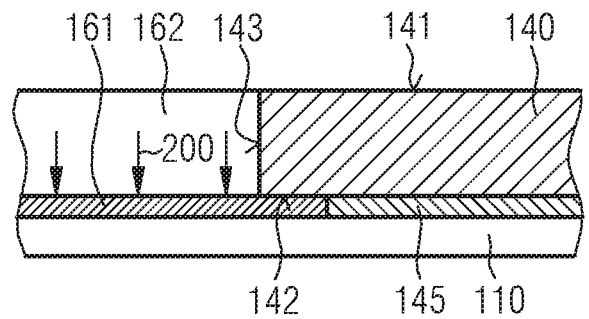

For this purpose, centrifuging the carrier 110 provided with the semiconductor component 140 and the layer arrangement is carried out, as is shown in FIG. 4. A centrifuge (not illustrated) is used during this process, which is carried out in a wet and flowable state of the two plastics layers 161, 162. The centrifuging is carried out in such a way that the layer arrangement and thus also the heavier first plastics layer 161 are pressed in the direction of the carrier 110 under the influence of the centrifugal force 200. In this way, a second configuration of the first plastics layer 161 is brought about, in which the lateral covering of the semiconductor component 140 with the plastics layer 161 is at least reduced, and the plastics layer 161 comprises an at least less curved layer surface, and in this respect a more uniform layer thickness profile, in cross section laterally with respect to the semiconductor component 140.

As is illustrated in FIG. 4, there is the possibility that the curvature of the first plastics layer 161 laterally with respect to the semiconductor component 140 is eliminated during the centrifuging and, consequently, the first plastics layer 161 comprises a planar layer surface and a uniform layer thickness profile. Furthermore, as is likewise shown in FIG. 4, the plastics layer 161 may no longer adjoin the sidewalls 143 of the semiconductor component 140 but instead may adjoin only the rear side 142 and the rear-side contact(s) 145 of the semiconductor component 140 and fill the interspace between the rear side 142 of the semiconductor component 140 and the carrier 110. For the case (not illustrated) where the method is carried out with a larger amount of material of the first plastics layer 161, in a departure from FIG. 4, the plastics layer 161 may comprise a larger layer thickness laterally with respect to the semiconductor component 140, and the sidewalls 143 of the semiconductor component 140 may be covered partly or slightly with the plastics layer 161.

Figure 5:
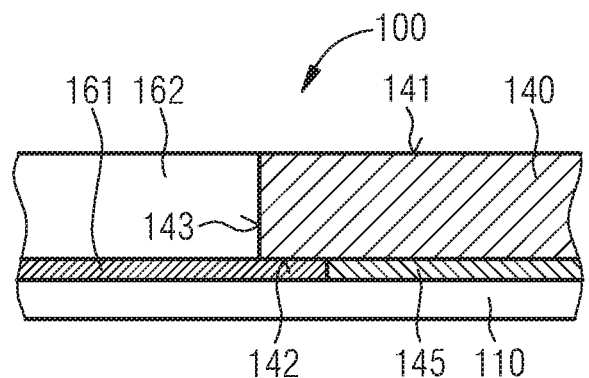

The principle of the density separation of fluids is utilized during the centrifuging. In this case, the greater density of the first plastics layer 161 has the consequence that intermixing of the two plastics layers 161, 162 is suppressed. Therefore, the plastics layers 161, 162 may be present as separate layers after the centrifuging as well, as is illustrated in FIG. 5.

After the centrifuging, the two plastics layers 161, 162 are still in an uncured and hence wet and flowable state. In this state, the second plastics layer 162 arranged on the first plastics layer 161 ensures that a reversion of the first plastics layer 161 to the first, that is to say curved or more greatly curved, configuration is suppressed. This is because the surface tension of the first plastics layer 161 may be neutralized with the aid of the second plastics layer 162. Consequently, the second, that is to say less curved or, as is shown in FIG. 5, planar, configuration of the first plastics layer 161 may be maintained.

In order to complete the semiconductor device 100, after the centrifuging, curing the two plastics layers 161, 162 is furthermore carried out. This may be carried out for example in an active way with the aid of a heating process or, depending on layer materials used, by means of irradiation with UV radiation (not illustrated). The semiconductor device 100 produced in this way comprises the carrier 110, on which are arranged the semiconductor component 140 and the layer arrangement laterally enclosing the semiconductor component 140 and comprising the particle-comprising first plastics layer 161 and the particle-free second plastics layer 162. On account of the production method, the first plastics layer 161 is present as a thin layer comprising a flat layer surface. The layer arrangement terminates flush with the front side 141 of the semiconductor component 140. It is optionally possible to use the carrier 110 only temporarily in the production method. In such a case (not illustrated), the carrier 110 may be removed in order to provide the semiconductor device 100 without a carrier 110, in a departure from FIG. 5.

As was described above, the semiconductor device 100 is a radiation-emitting semiconductor device 100, the semiconductor component 140 of which may be formed for emitting radiation via the front side 141 and via the sidewalls 143. The configuration of the semiconductor device 100 comprising the radiation-transmissive second plastics layer 162 and the reflective first plastics layer 161, which does not cover or only partly covers the sidewalls 143, enables radiation to be coupled out also via the sidewalls 143 of the semiconductor component 140. Consequently, the semiconductor device 100 may be distinguished by an efficient mode of operation. A radiation emitted in the direction of the first plastics layer 161 during operation of the semiconductor device 100 may be reflected at the layer in an efficient manner.

Possible variants and modifications of the method sequence explained with reference to FIGS. 1 to 5 are described below. In these method sequences, a plurality of semiconductor devices 100 are produced jointly in an assemblage and are singulated into separate semiconductor devices 100 at the end of the method. Corresponding method steps and features and also identical and identically acting components and layers are not described in detail again below. Instead, for details in respect thereof, reference is made to the description above. Furthermore, aspects and details mentioned with regard to one method variant may also be applicable with regard to another method variant and features of two or more configurations may be combined with one another.

Figure 7:
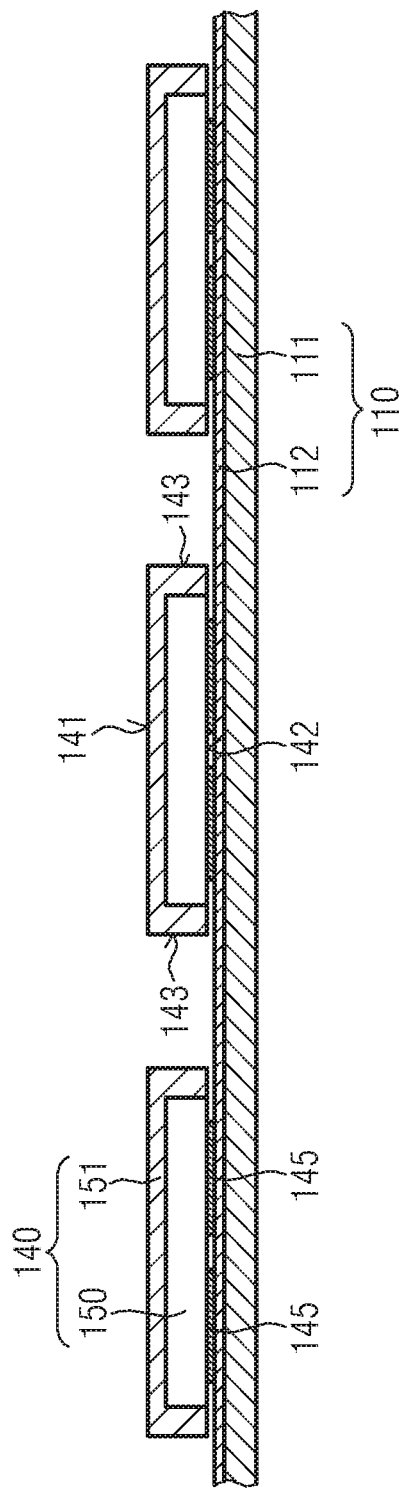
FIGS. 7 to 11 show a further method sequence for producing semiconductor devices, wherein a temporary carrier with CSP semiconductor components is provided, a layer arrangement adjoining the semiconductor components and comprising a first and a second plastics layer is provided on the carrier, and centrifuging, singulating and removing the carrier are carried out.

FIGS. 7 to 11 show in an excerpt, on the basis of lateral sectional illustrations, a method for jointly producing radiation-emitting semiconductor devices 100. In the method, as is shown in FIG. 7, a carrier 110 with a plurality of radiation-emitting semiconductor components 140 arranged next to one another on the carrier 110 is provided. The carrier 110 is a temporary carrier 111 comprising an adhesive film 112 on a main side. The semiconductor components 140 are arranged on the adhesive film 112 and thereby fixed thereon.

The carrier 111 is used only for auxiliary purposes in the production method and is removed again together with the adhesive film 112 at the end of the method. In order to facilitate this, an adhesive film 112 is used whose adhesive property may subsequently be eliminated or at least reduced, for example, by action of temperature or irradiation with UV radiation. Furthermore, a frame-shaped delimiting structure (not illustrated) may be arranged on the carrier 111 or on the adhesive film 112 thereof. An enclosed region for subsequent material application may be defined in this way.

The semiconductor components 140 are CSP semiconductor components (chip size package) comprising, as shown in FIG. 7, a radiation-emitting semiconductor chip 150 and a conversion layer 151 for radiation conversion covering the semiconductor chip 150 on the front side and circumferentially. The semiconductor chips 150 are LED chips in the form of volume emitting flip-chips comprising two rear-side metallic contacts 145 and constituents (not illustrated) such as a semiconductor layer sequence comprising an active zone for generating radiation and a radiation-transmissive chip substrate. Via the contacts 145, the semiconductor chips 150 may be supplied with electrical energy. The semiconductor chips 150 may be sapphire flip-chips.

The semiconductor chips 150 are configured for emitting a primary light radiation. By way of the associated conversion layers 151, the primary light radiation may be converted at least partly into at least one secondary light radiation of longer wavelength. The primary radiation and the secondary radiation may be a blue and a yellow light radiation, for example. As a result, the semiconductor components 140 may generate a white light radiation during operation. The emission of radiation may be carried out via a front side 141 and via lateral sidewalls 143 of the semiconductor components 140. In the present configuration, the front sides 141 and sidewalls 143 of the semiconductor components 140 are constituted by the conversion layers 151.

Figure 8:
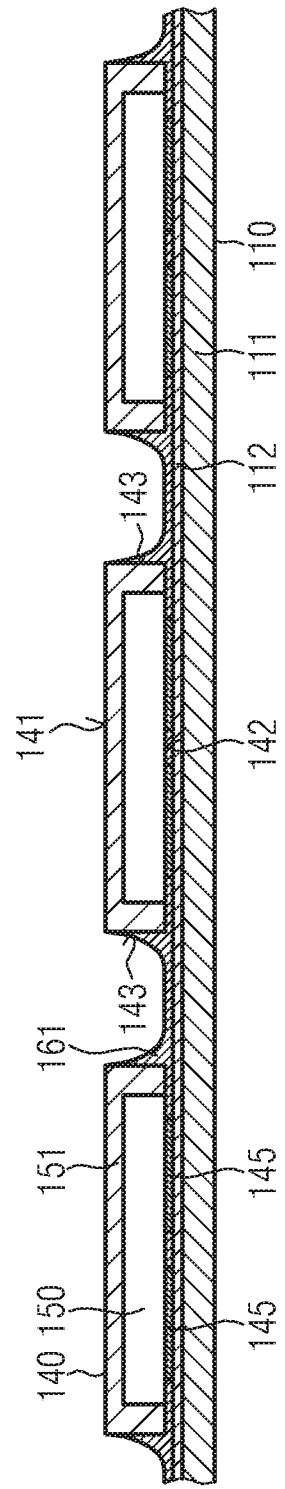

The method subsequently involves providing a layer arrangement on the adhesive film 112 of the carrier 111, the layer arrangement adjoining the semiconductor components 140 and laterally enclosing the semiconductor components 140. As is shown in FIG. 8, firstly a flowable first plastics layer 161 is formed laterally and between the semiconductor components 140. This is associated with a lateral wetting of the semiconductor components 140. As a result, the first plastics layer 161 comprises a first configuration comprising a layer surface that is concavely curved in cross section, and a nonuniform layer thickness profile laterally with respect to the semiconductor components 140. The plastics layer 161 extends as far as the front sides 141 of the semiconductor components 140. Furthermore, the plastics layer 161 is located partly below the semiconductor components 140 and in these regions adjoins rear sides 142 and contacts 145 of the semiconductor components 140. The plastics layer 161 comprises the above-described configuration comprising reflective particles.

Figure 9:
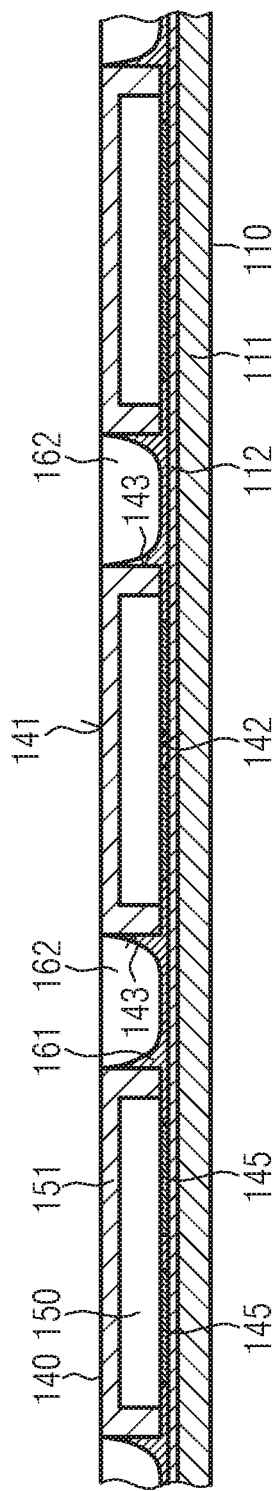

As is illustrated in FIG. 9, a flowable, radiation-transmissive and particle-free second plastics layer 162 is subsequently formed on the still wet and flowable first plastics layer 161 laterally and between the semiconductor components 140. The second plastics layer 162 likewise extends as far as the front sides 141 of the semiconductor components 140. Furthermore, the plastics layer 162 and thus the layer arrangement comprising the two plastics layers 161, 162 terminate flush with the front sides 141 of the semiconductor components 140, such that a planarization is achieved.

Figure 10:
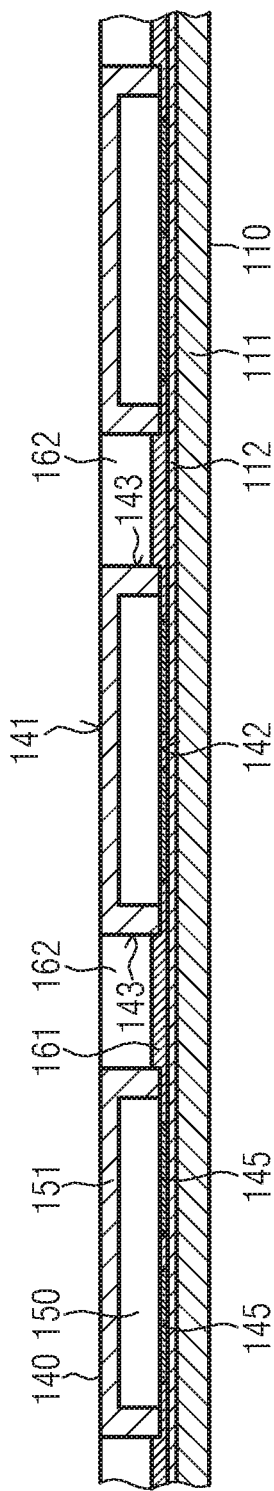

Centrifuging the carrier 110 provided with the semiconductor components 140 and the layer arrangement is then carried out, such that the surface curvature of the first plastics layer 161 and the lateral covering of the semiconductor components 140 with the first plastics layer 161 are at least reduced and, as a result, the plastics layer 161 comprises a second configuration comprising a layer thickness profile made more uniform laterally with respect to and between the semiconductor components 140. As is shown in FIG. 10, what may be achieved as a result of the centrifuging is that the first plastics layer 161 comprises a planar layer surface and a uniform layer thickness profile laterally with respect to and between the semiconductor components 140. Moreover, the sidewalls 143 of the semiconductor components 140 may be covered just slightly with the plastics layer 161. The second plastics layer 162 arranged on the first plastics layer 161 may ensure that the state shown in FIG. 10 is maintained.

Figure 11:
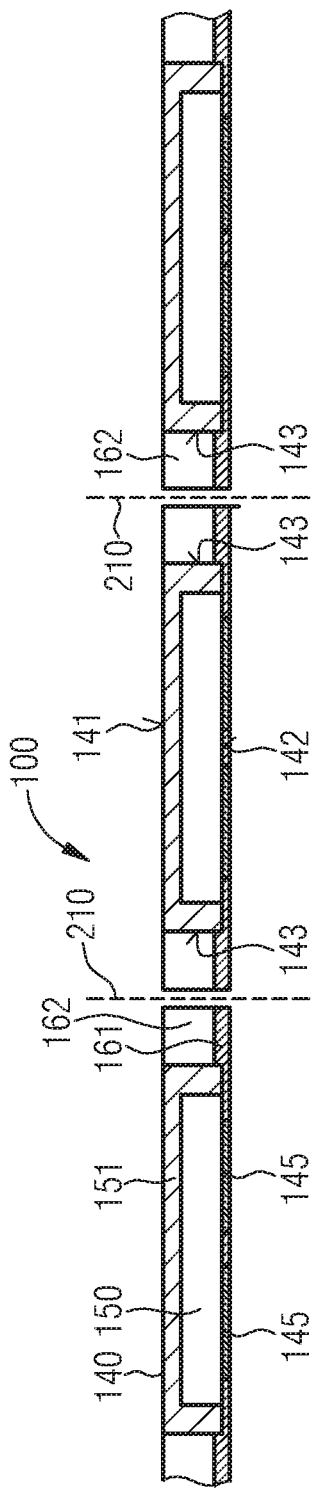

This is followed by curing the two plastics layers 161, 162 and also further method steps such as singulating the device assemblage into separate semiconductor devices 100 and removing the carrier 111 with the adhesive film 112, as is shown in FIG. 11. The singulating may be carried out before removing the carrier 111. During this process, the layer arrangement comprising the two plastics layers 161, 162 is severed, for example, by means of sawing, next to and between the semiconductor components 140 along separating lines 210 and is subdivided into separate layer arrangements in this way. In the context of removing the carrier 111, the adhesive property of the adhesive film 112 is eliminated or at least reduced by action of temperature or irradiation with UV radiation. In regard to irradiation, the carrier 111 used is transmissive to UV radiation (not illustrated in each case).

The semiconductor devices 100 produced with the aid of the method sequence in FIGS. 7 to 11 comprise a radiation-emitting semiconductor component 140 laterally enclosed by a layer arrangement comprising the two plastics layers 161, 162. The first plastics layer 161, embodied as thinner in comparison with the second plastics layer 162, is located in each case in the region of the rear side of the semiconductor devices 100. The first plastics layer 161 may serve as a white reflector layer of the semiconductor devices 100. The semiconductor devices 100 may be contacted and energized via the rear-side contacts 145.

Figure 12:
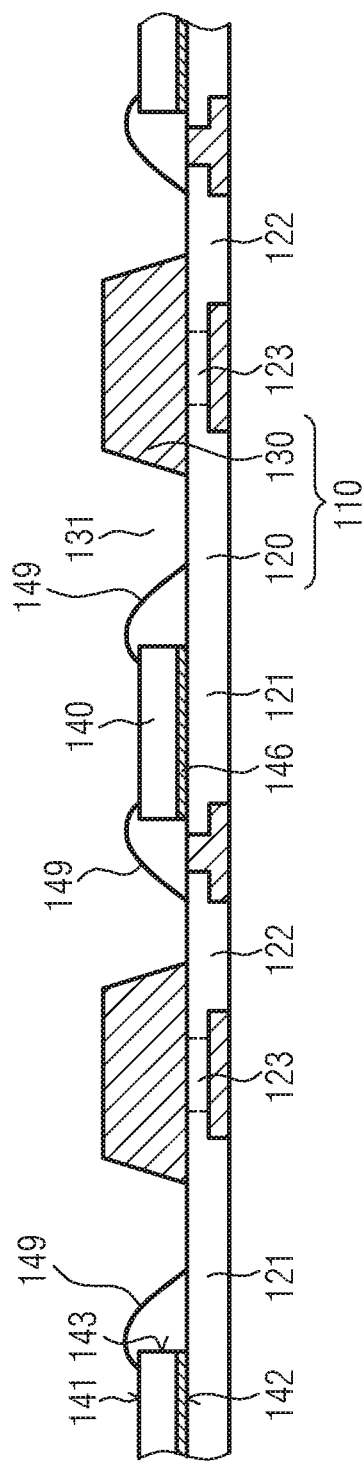
FIGS. 12 to 18 show a further method sequence for producing semiconductor devices, wherein a leadframe-based carrier comprising cavities and semiconductor chips located within the cavities is provided, layer arrangements adjoining the semiconductor chips and comprising a first and a second plastics layer are provided in the cavities, centrifuging is carried out, sedimented conversion layers are formed in the cavities, and singulating is carried out.

FIGS. 12 to 18 show in an excerpt, on the basis of lateral sectional illustrations, a further method for jointly producing radiation-emitting semiconductor devices 100. In the method, as is illustrated in FIG. 12, a carrier 110 with a plurality of radiation-emitting semiconductor components 140 arranged thereon is provided. The carrier 110 used is a leadframe-based carrier 110 comprising cavities 131, in each of which one of the semiconductor components 140 is arranged. The cavities 131 may comprise, as seen in plan view, for example, a rectangular contour (not illustrated).

The carrier 110 shown in FIG. 12 comprises a metallic leadframe 120 and a plastics body 130 partly surrounding the leadframe 120. The cavities 131 or circumferential inner walls of the cavities 131 are constituted by the plastics body 130. The cavities 131 comprise in cross section a shape that widens in the direction of a front side of the plastics body 130, as a result of which the cavities 131 may serve as reflectors.

The leadframe 120 may be formed for example, from copper with a coating of silver (not illustrated). The leadframe 120 comprises a larger leadframe section 121 and a smaller leadframe section 122 for each of the semiconductor devices 100 to be produced. The semiconductor components 140 are respectively arranged on one of the leadframe sections 121. The leadframe sections 121, 122 comprise a stepped shape at the edge. An anchoring of the plastics body 130 to the leadframe 120 may be achieved in this way. The leadframe sections 121, 122 of different semiconductor devices 100 to be fabricated are connected to one another with the aid of web-shaped connecting structures 123 of the leadframe 120. In FIG. 12, the stepped shape of the leadframe sections 121, 122, which is present in a manner laterally offset with respect to the connecting structures 123 perpendicular to the plane of the drawing, is indicated on the basis of dashed lines.

As is furthermore illustrated in FIG. 12, the semiconductor components 140 used are radiation-emitting semiconductor chips 140. The semiconductor chips 140 are volume emitting LED chips comprising a rear-side metallization serving as a base 146 and constituents (not illustrated) such as a semiconductor layer sequence comprising an active zone for generating radiation, a radiation-transmissive chip substrate and two front-side contacts. Via the contacts, the semiconductor chips 140 may be supplied with electrical energy. The rear-side metallic base 146 may be formed from silver, for example, and comprise a thickness of 50 µm, for example. The semiconductor chips 140 are configured for emitting radiation via a front side 141 and via lateral sidewalls 143. A rear side 142 of the semiconductor chips 140 may be constituted completely by the rear-side metallic base 146. The semiconductor chips 140 may be volume emitting sapphire chips comprising a chip substrate comprising sapphire.

During the process of arranging the semiconductor chips 140 on the carrier 110, the semiconductor chips 140 are mechanically connected to the leadframe sections 121 of the leadframe 120 by way of the rear-side metallic bases 146 and using a connecting material (not illustrated). The connecting material may be a solder or an adhesive, for example. Furthermore, the front-side contacts of the semiconductor chips 140 are electrically connected, with the aid of bond wires 149, to the leadframe sections 121 respectively carrying the semiconductor chip 140 and to the respectively adjacent leadframe sections 122 accessible via the same cavities 131.

Figure 13:
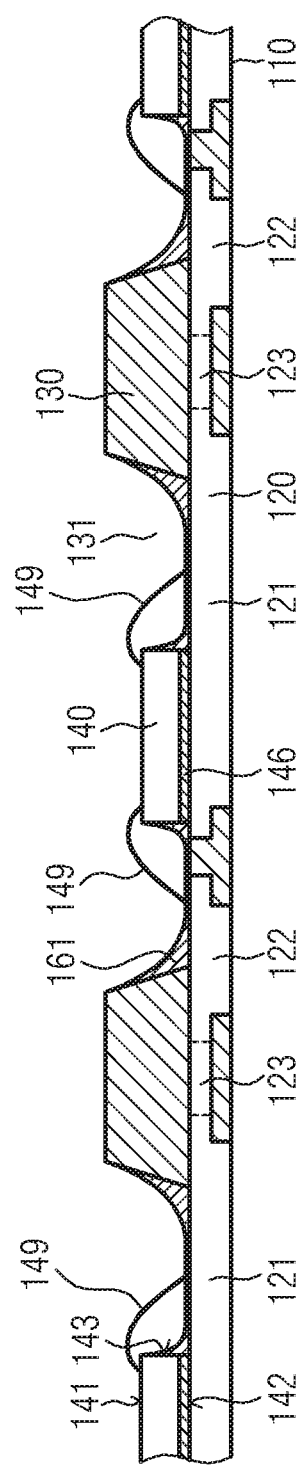

After chip mounting, separate layer arrangements adjoining the semiconductor chips 140 and laterally enclosing the semiconductor chips 140 are provided in the cavities 131 of the carrier 110. As is shown in FIG. 13, firstly flowable first plastics layers 161 are formed laterally with respect to the semiconductor chips 140 in the cavities 131. In this case, a lateral wetting of the semiconductor chips 140 takes place, such that the first plastics layers 161 comprise a first configuration comprising a layer surface curved concavely in cross section and a nonuniform layer thickness profile laterally with respect to the semiconductor chips 140. The plastics layers 161 extend as far as the front sides 141 of the semiconductor chips 140. A lateral wetting with the plastics layers 161 furthermore takes place at the plastics body 131, i.e., at the inner walls of the cavities 131, such that the plastics layers 161 comprise a concavely curved layer surface in these regions as well. Furthermore, the plastics layers 161 extend as far as the front side of the plastics body 130. The plastics layers 161 comprise the above-described configuration comprising reflective particles.

Figure 14:
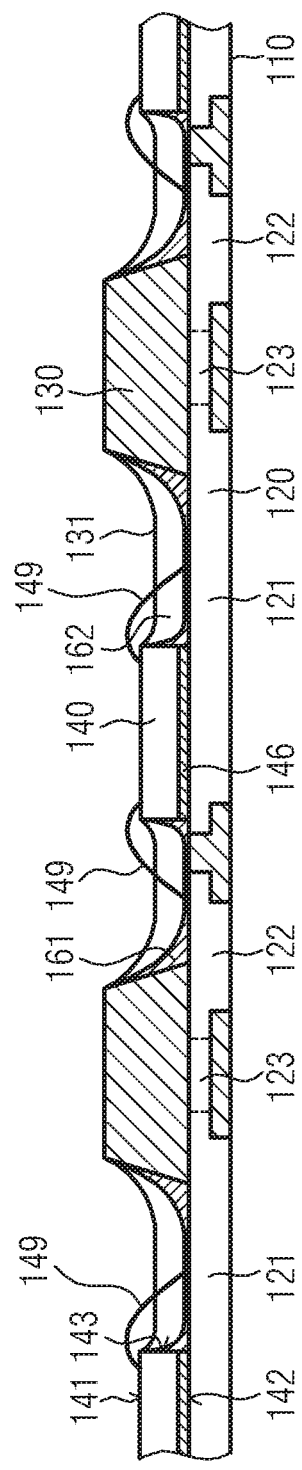

After that, as is illustrated in FIG. 14, flowable, radiation-transmissive and particle-free second plastics layers 162 are formed in the cavities 131 of the carrier 110 laterally with respect to the semiconductor chips 140 on the still wet and flowable first plastics layers 161. This is done using an amount of material of the second plastics layers 162 such that the plastics layers 162 likewise extend as far as the front sides 141 of the semiconductor chips 140. Moreover, the plastics layers 162 may extend as far as the front side of the plastics body 130. In this case, the plastics layers 162 may comprise a concavely curved layer surface laterally with respect to the semiconductor chips 140 and laterally with respect to the inner walls of the cavities 131.

Figure 15:
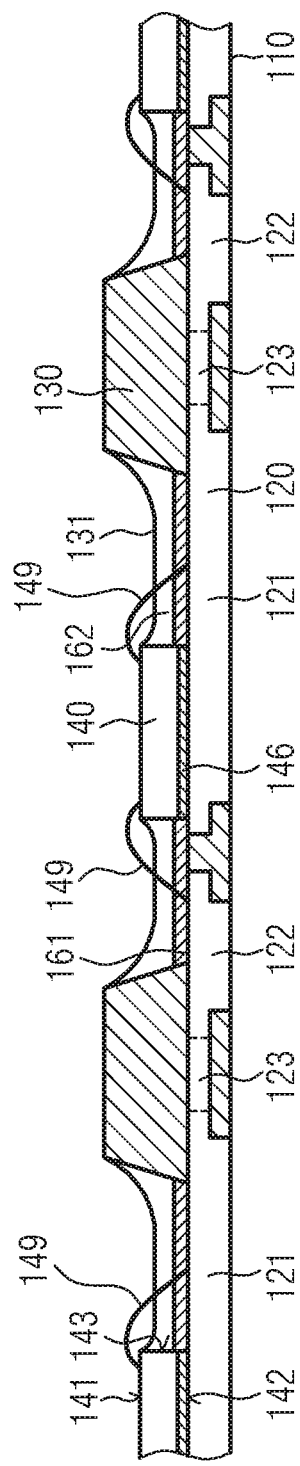

Afterward, centrifuging the carrier 110 provided with the semiconductor chips 140 and the layer arrangements is carried out in order at least to reduce the surface curvature of the first plastics layers 161 laterally with respect to the semiconductor chips 140 and the lateral covering of the semiconductor chips 140 with the plastics layers 161. As is shown in FIG. 15, what may be achieved as a result of the centrifuging is that the first plastics layers 161 comprise a second configuration comprising a planar layer surface and a uniform layer thickness profile laterally with respect to the semiconductor chips 140 and laterally with respect to the inner walls of the cavities 131. The sidewalls 143 of the semiconductor chips 140 may be covered just slightly with the plastics layers 161. With the aid of the second plastics layers 162, which may comprise a (more) planar manifestation (not illustrated) in the course of the centrifuging and may assume the configuration shown in FIG. 15 after the centrifuging, the state shown in FIG. 15 may be maintained.

Figure 16:
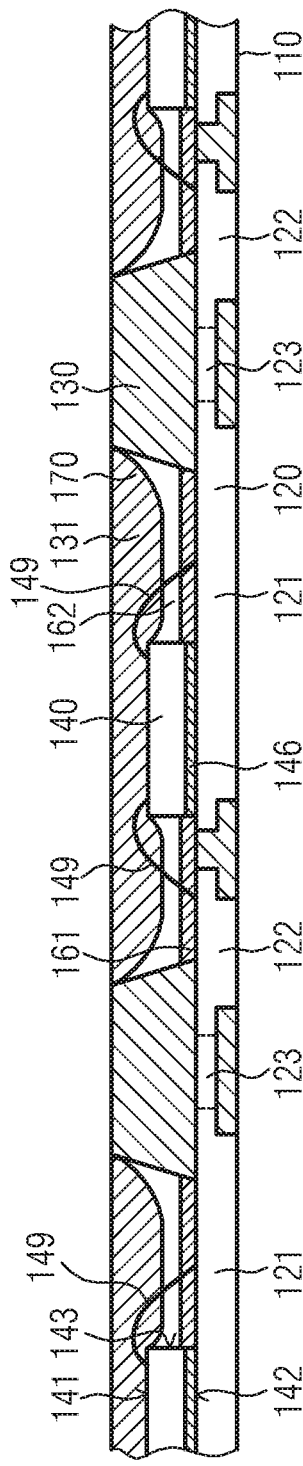
Figure 17:
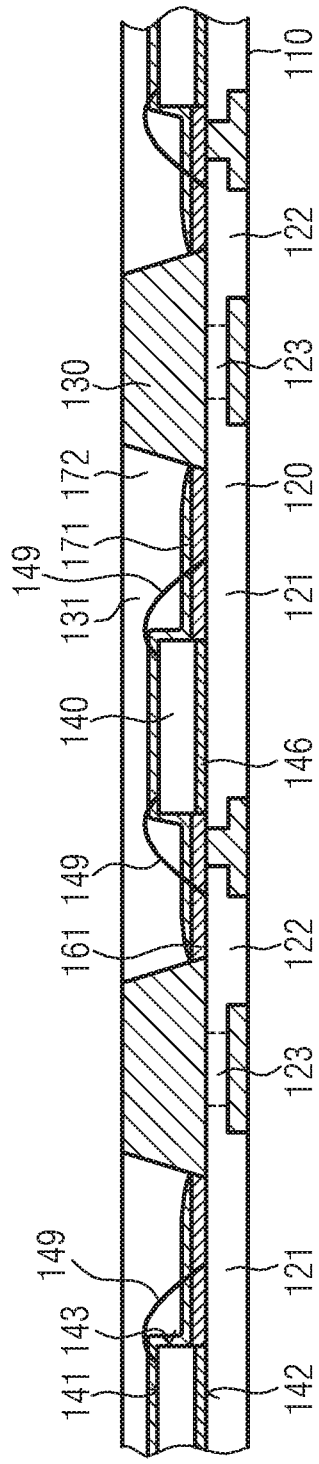

As is illustrated in FIG. 16, conversion layers 170 covering the semiconductor chips 140 and the second plastics layers 162 are subsequently formed in the cavities 131, the conversion layers terminating flush with the front side of the plastics body 130. For this purpose, a flowable plastics or silicone material containing phosphor particles is introduced into the cavities 131, for example, with the aid of a dispenser (not illustrated). Sedimenting the phosphor particles is subsequently carried out. As a result, as is shown in FIG. 17, sedimented conversion layers 171 are formed on the semiconductor chips 140 and on the first plastics layers 161, which are covered in each case by a further plastics layer 172. The processes mentioned above are carried out in a non-cured and hence wet and flowable state of the layers 161, 162, 170. The sedimented conversion layers 171 comprise a high concentration of phosphor particles. In contrast thereto, the layers 172 situated there above may comprise no or a small and hence negligible proportion of phosphor particles, and therefore be radiation-transmissive or clear silicone layers.

Figure 18:
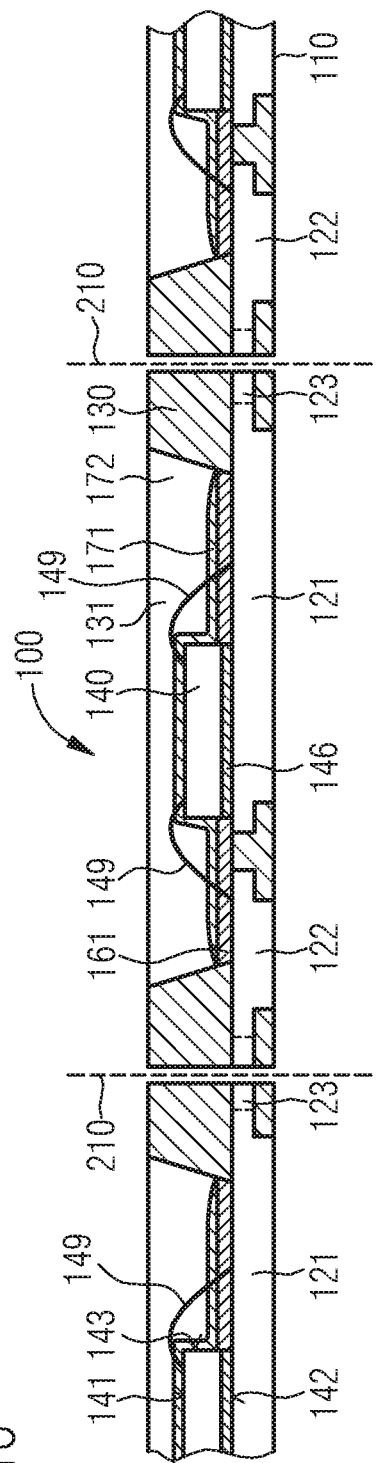

Afterward or after the layers 161, 171, 172 have been cured, as is illustrated in FIG. 18, singulating the device assemblage into separate semiconductor devices 100 is carried out. During this process, carried out by means of sawing, for example, the carrier 110, i.e., the plastics body 130 and the leadframe 120, is severed in the region of the connecting structures 123 along separating lines 210. In this way, the leadframe sections 121, 122 in the individual semiconductor devices 100 are no longer connected to one another by way of material of the leadframe 120.

The semiconductor devices 100 produced with the aid of the method sequence in FIGS. 12 to 18 each comprise a part of the carrier 110 comprising a cavity 131, in which are arranged a semiconductor chip 140, a reflective plastics layer 161 laterally enclosing the semiconductor chip 140, a sedimented conversion layer 171 arranged on the plastics layer 161 and laterally enclosing the semiconductor chip 140 and covering the latter on the front side, and a radiation-transmissive plastics layer 172 covering the conversion layer 171. The semiconductor devices 100 may be contacted and energized via the leadframe sections 121, 122, which are electrically connected to the front-side contacts of the semiconductor chips 140 via the bond wires 149. A primary radiation emitted by a semiconductor chip 140 during operation may be converted at least partly into at least one secondary radiation of longer wavelength with the aid of the associated conversion layer 171. The primary radiation and the secondary radiation may be a blue and a yellow light radiation, for example. In this way, the semiconductor devices 100 may generate a white light radiation and emit it via their plastics layer 172. The rear-side metallic base 146 of a semiconductor chip 140 may serve as a reflector in the semiconductor devices 100, and furthermore enable efficient heat conduction and thermal linking of the semiconductor chip 140 to the associated leadframe section 121. Moreover, the base 146 may serve as a spacer, which promotes lateral coupling of radiation out of the semiconductor chip 140.

Figure 19:
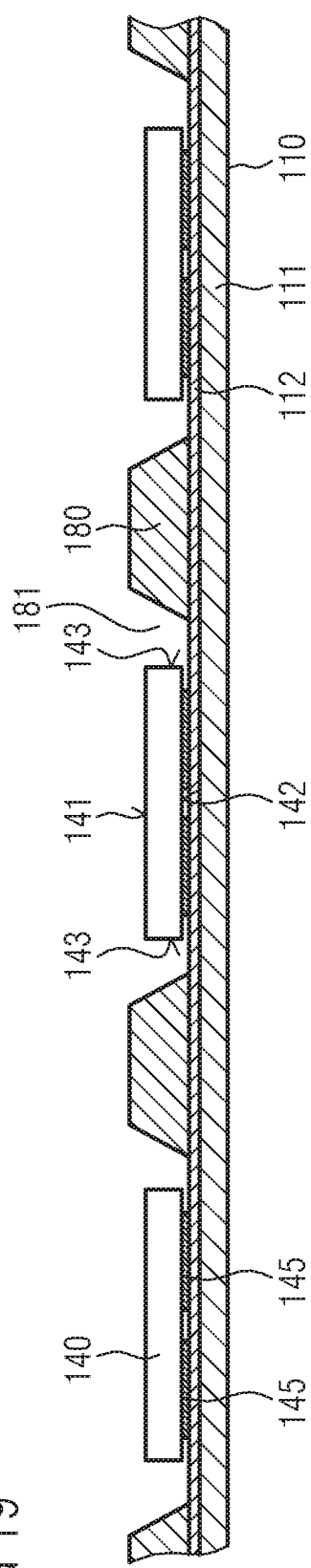
FIGS. 19 to 24 show a further method sequence for producing semiconductor devices, wherein a temporary carrier comprising a wall structure enclosing cavities and semiconductor chips located within the cavities is provided, layer arrangements adjoining the semiconductor chips and comprising a first and a second plastics layer are provided in the cavities, centrifuging is carried out, conversion layers are formed in the cavities, and singulating and removing the carrier are carried out.

FIGS. 19 to 24 show in an excerpt, on the basis of lateral sectional illustrations, a further method for jointly producing radiation-emitting semiconductor devices 100. In the method, as is illustrated in FIG. 19, a carrier 110 is provided, on which a wall structure 180 comprising cavities 181 and radiation-emitting semiconductor components 140 are arranged. A semiconductor component 140 is located in each cavity 181. The carrier 110 used is a temporary carrier 111 with an adhesive film 112. The wall structure 180 and the semiconductor components 140 are arranged on the adhesive film 112 and consequently fixed on the latter.

The wall structure 180 may be formed from a white reflective plastics material such as an epoxy material, for example. As seen in plan view, the wall structure 180 may comprise a lattice shape, and the cavities 181 may comprise a rectangular contour (not illustrated). The cavities 181 comprise in cross section a shape that widens in the direction of a front side of the wall structure 180, and may therefore serve as reflectors.

As is furthermore illustrated in FIG. 19, the semiconductor components 140 used are radiation-emitting semiconductor chips 140. The semiconductor chips 140 are LED chips in the form of volume emitting flip-chips comprising two rear-side metallic contacts 145 and constituents (not illustrated) such as a semiconductor layer sequence comprising an active zone for generating radiation and a radiation-transmissive chip substrate. The semiconductor chips 140 may be energized via the contacts 145. The semiconductor chips 140 are configured for emitting radiation via a front side 141 and via lateral sidewalls 143. The semiconductor chips 140 may be sapphire flip-chips comprising a chip substrate comprising sapphire.

Figure 20:
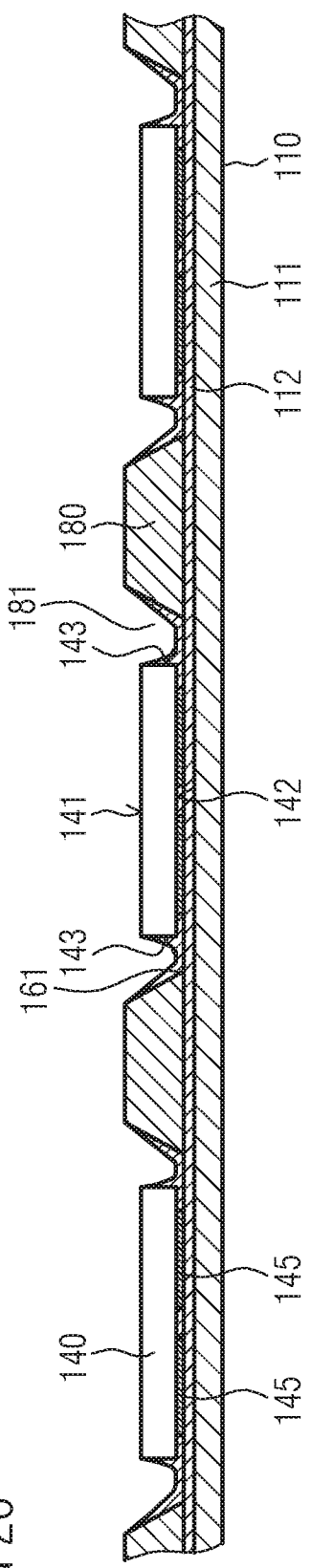

In the method, separate layer arrangements adjoining the semiconductor chips 140 and laterally enclosing the semiconductor chips 140 are subsequently provided in the cavities 181 of the wall structure 180 on the adhesive film 112 of the carrier 111. As is shown in FIG. 20, firstly flowable first plastics layers 161 are formed laterally with respect to the semiconductor chips 140 in the cavities 181. In this case, a lateral wetting of the semiconductor chips 140 occurs, such that the first plastics layers 161 comprise a first configuration comprising a layer surface curved concavely in cross section and a nonuniform layer thickness profile laterally with respect to the semiconductor chips 140. The plastics layers 161 extend as far as the front sides 141 of the semiconductor chips 140. Furthermore, the plastics layers 161 are located in part below the semiconductor chips 140 and at these locations adjoin rear sides 142 and contacts 145 of the semiconductor chips 140. A lateral wetting with the plastics layers 161 is furthermore present at the wall structure 180, i.e., at inner walls of the cavities 181, such that the plastics layers 161 comprise a concavely curved layer surface in these regions as well. Moreover, the plastics layers 161 extend as far as the front side of the wall structure 180. The first plastics layers 161 comprise the above-described configuration comprising reflective particles.

Figure 21:
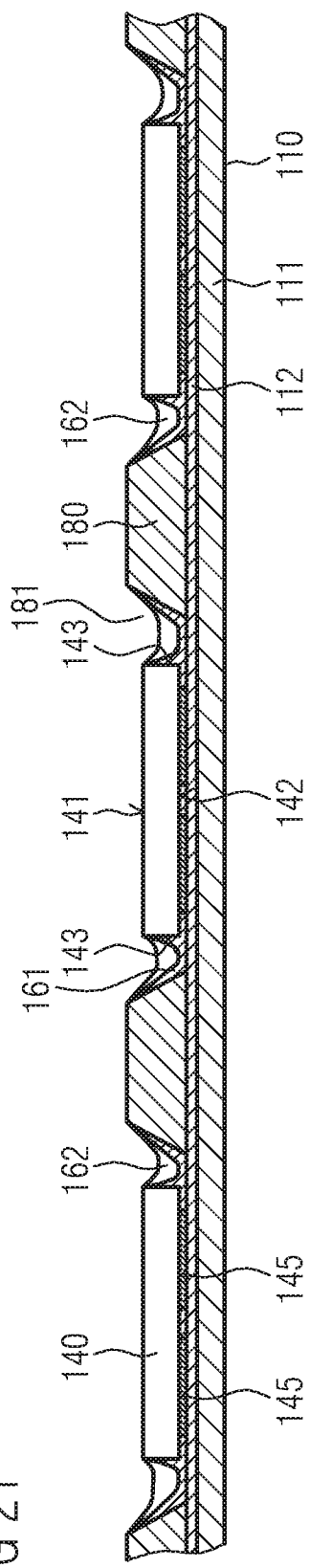

As is illustrated in FIG. 21, flowable, radiation-transmissive and particle-free second plastics layers 162 are subsequently formed in the cavities 181 of the wall structure 180 laterally with respect to the semiconductor chips 140 on the still wet and flowable first plastics layers 161. This is done using an amount of material of the second plastics layers 162 such that the plastics layers 162 likewise extend as far as the front sides 141 of the semiconductor chips 140. Moreover, the plastics layers 162 may extend as far as the front side of the wall structure 180. In this case, the plastics layers 162 comprise a concavely curved layer surface laterally with respect to the semiconductor chips 140 and laterally with respect to the inner walls of the cavities 181.

Figure 22:
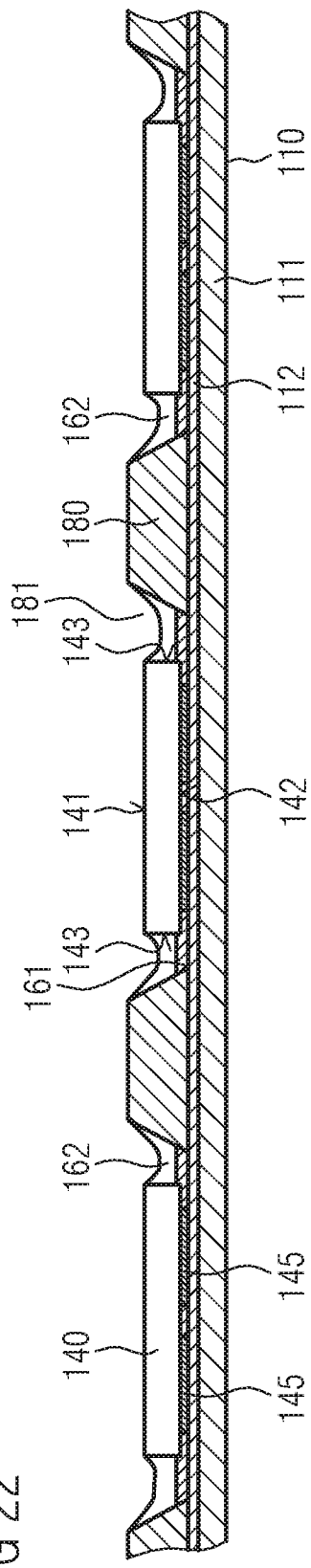

Afterward, centrifuging is carried out in order at least to reduce the surface curvature of the first plastics layers 161 laterally with respect to the semiconductor chips 140 and the lateral covering of the semiconductor chips 140 with the plastics layers 161. As is shown in FIG. 22, owing to the centrifuging, the first plastics layers 161 may comprise a second configuration comprising a planar layer surface and a uniform layer thickness profile laterally with respect to the semiconductor chips 140 and laterally with respect to the inner walls of the cavities 181. The sidewalls 143 of the semiconductor chips 140 may be covered just slightly with the plastics layers 161. With the aid of the second plastics layers 162, which comprise a (more) planar configuration (not illustrated) in the course of the centrifuging and may assume the configuration shown in FIG. 22 after the centrifuging, the state shown in FIG. 22 may be maintained.

Figure 23:
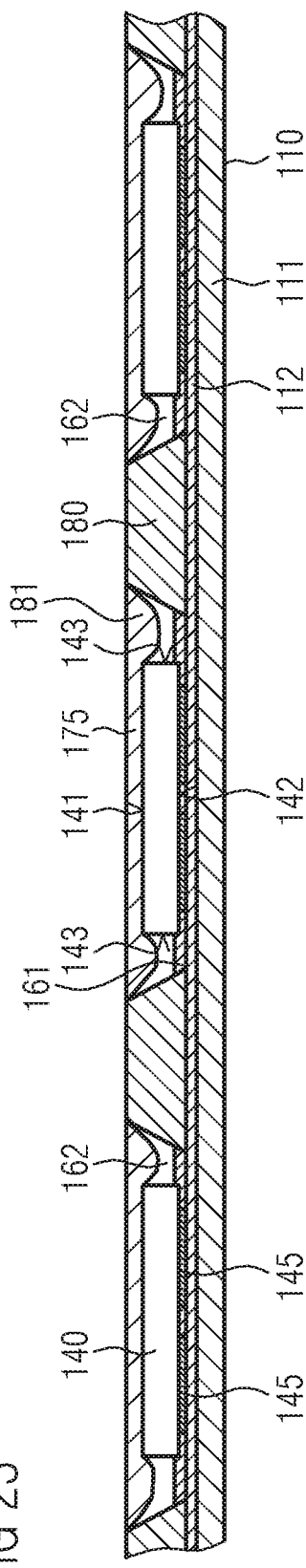

Afterward, as is shown in FIG. 23, conversion layers 175 covering the semiconductor chips 140 and the second plastics layers 162 are formed in the cavities 181, which conversion layers terminate flush with the front side of the wall structure 180. For this purpose, a flowable plastics or silicone material comprising phosphor particles is introduced into the cavities 181, for example, with the aid of a dispenser (not illustrated).

Figure 24:
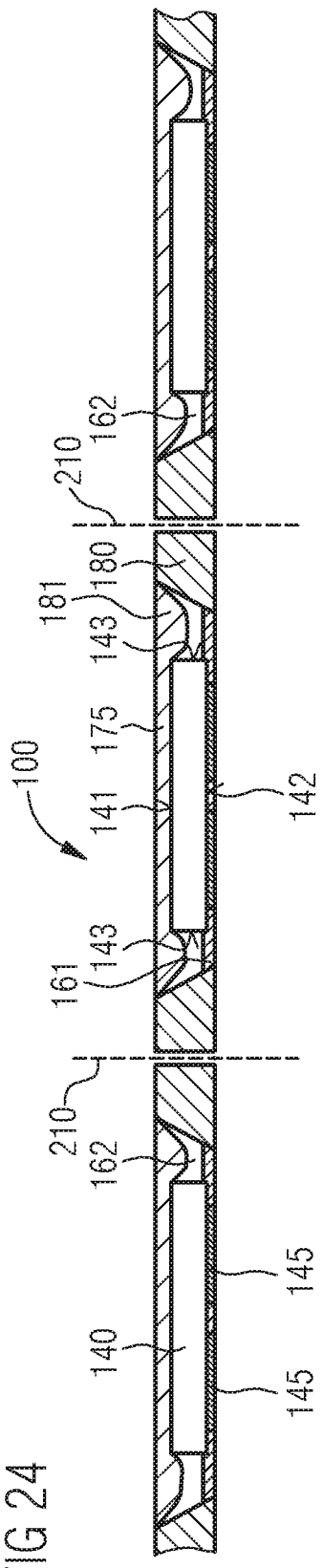

Afterward or after the layers 161, 162, 175 have been cured, as is shown in FIG. 24, further method steps such as singulating the device assemblage into separate semiconductor devices 100 and removing the carrier 111 with the adhesive film 112 are carried out. The singulating may be carried out before removing the carrier 111. During the singulating, the wall structure 180 is severed along separating lines 210 by means of sawing, for example, and in this way may be subdivided into frame-shaped wall structures 180 each enclosing a cavity 181.

The semiconductor devices 100 produced with the aid of the method sequence in FIGS. 19 to 24 each comprise such a frame-shaped wall structure 180 comprising a cavity 181, in which are arranged a semiconductor chip 140, a reflective plastics layer 161 laterally enclosing the semiconductor chip 140 and partly covering the semiconductor chip 140 on the rear side, a radiation-transmissive or clear plastics layer 162 covering the plastics layer 161 and laterally enclosing the semiconductor chip 140, and a conversion layer 175 covering the semiconductor chip 140 and the plastics layer 162. The semiconductor devices 100 may be contacted and energized via the rear-side contacts 145. A primary radiation emitted by a semiconductor chip 140 during operation may be converted at least partly into at least one secondary radiation of longer wavelength with the aid of the associated conversion layer 175. In this way, the semiconductor devices 100 may emit a white light radiation via the conversion layer 175.

FIGS. 25 to 3o show in an excerpt, on the basis of lateral sectional illustrations, a further method for jointly producing radiation-emitting semiconductor devices 100. In the method, as is shown in FIG. 25, a carrier 110 with a plurality of radiation-emitting semiconductor components 140 arranged on the carrier 110 is provided. The carrier 110 used is a temporary carrier 111 with an adhesive film 112. The semiconductor components 140 are arranged on the adhesive film 112.

The semiconductor components 140 are CSP semiconductor components comprising, as shown in FIG. 25, a radiation-emitting semiconductor or LED chip comprising a semiconductor layer sequence 154 comprising an active zone for generating radiation (not illustrated) and comprising two rear-side metallic contacts 145. The semiconductor chips may be flip-chips configured for front-side radiation emission. The semiconductor components 140 may be energized via the contacts 145. Below the semiconductor layer sequence 145, a filling layer 153 terminating flush with the contacts 145 is located laterally with respect to and between the contacts 145. The filling layer 153, which may be formed from a reflective plastics material, together with the contacts 145 forms a rear side 142 of the semiconductor components 140. Further constituents are a conversion layer 155 for radiation conversion arranged on the semiconductor layer sequence 154, and a radiation-transmissive covering 156 arranged on the conversion layer 155. The covering 156, which constitutes a front side 141 of the semiconductor components 140, may be formed from a glass material, for example. The semiconductor layer sequence 154 serves for emitting a primary radiation on the front side. By way of the associated conversion layer 155, the primary radiation may be converted at least partly into at least one secondary radiation of longer wavelength. In this way, the semiconductor components 140 may generate a white light radiation during operation, which may be emitted via the front side 141 and via lateral sidewalls 143.

In the method, a layer arrangement adjoining the semiconductor components 140 and laterally enclosing the semiconductor components 140 is subsequently provided on the adhesive film 112 of the carrier 111. As is shown in FIG. 26, firstly a flowable first plastics layer 161 is formed laterally with respect to and between the semiconductor components 140. In this case, a lateral wetting of the semiconductor components 140 takes place, such that the first plastics layer 161 comprises a first configuration comprising a layer surface curved concavely in cross section and a nonuniform layer thickness profile laterally with respect to the semiconductor components 140. The plastics layer 161 extends as far as the front sides 141 of the semiconductor components 140. The plastics layer 161 comprises the above-described configuration comprising reflective particles.

As is shown in FIG. 27, a flowable, radiation-transmissive and particle-free second plastics layer 162 is subsequently formed on the still wet and flowable first plastics layer 161. The second plastics layer 162 likewise extends as far as the front sides 141 of the semiconductor components 140 and terminates flush with the front sides 141 of the semiconductor components 140.

Centrifuging is subsequently carried out in order at least to reduce the surface curvature of the first plastics layer 161 laterally with respect to the semiconductor components 140. As is shown in FIG. 28, owing to the centrifuging, the first plastics layer 161 may comprise a second configuration comprising a planar layer surface and a uniform layer thickness profile laterally with respect to and between the semiconductor components 140. In this case, the sidewalls 143 of the semiconductor components 140 are only partly covered with the plastics layers 161. With the aid of the second plastics layer 162, the state shown in FIG. 28 may be maintained.

Figure 29:
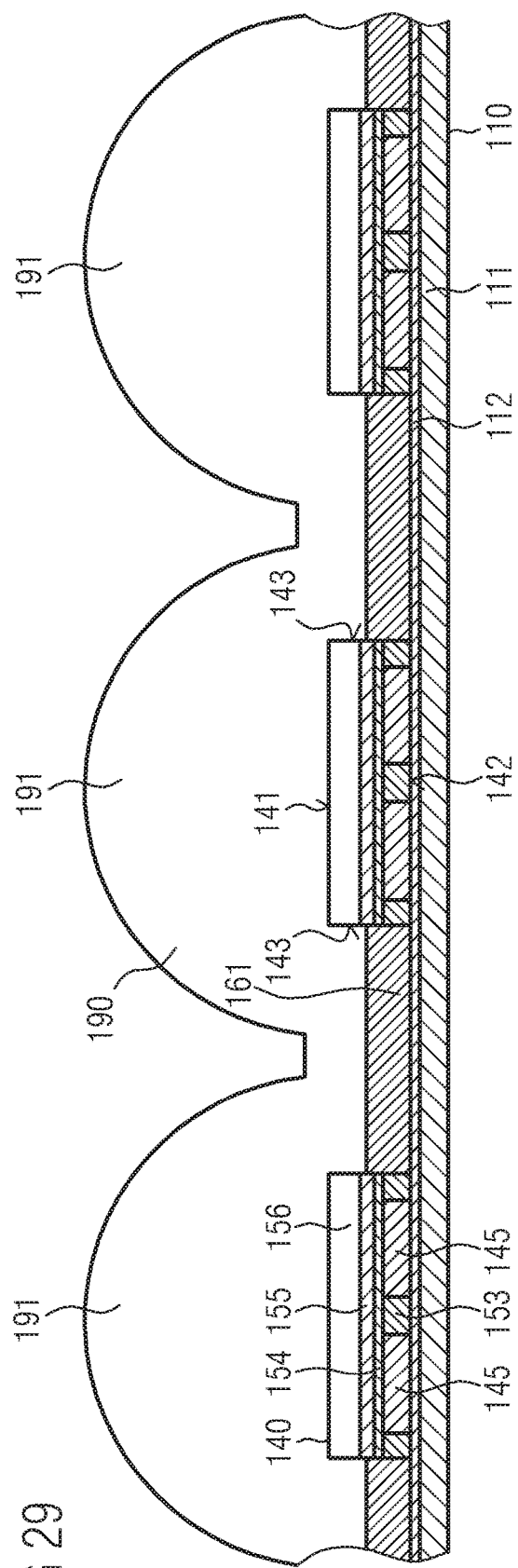

Afterward, as is shown in FIG. 29, a lens layer 190 comprising a structure comprising lenses 191 arranged next to one another is formed, which is arranged on the first plastics layer 161 and on the semiconductor components 140. Each semiconductor component 140 is assigned one of the lenses 191. For forming the lens layer 190, a flowable and radiation-transmissive or clear plastics material corresponding to the material of the second plastics layer 162 is applied in the form of the lens structure on the still wet and flowable plastics layer 162. In this respect, the lens layer 190 is constituted by the second plastics layer 162 and the newly applied plastics material.

Figure 30:
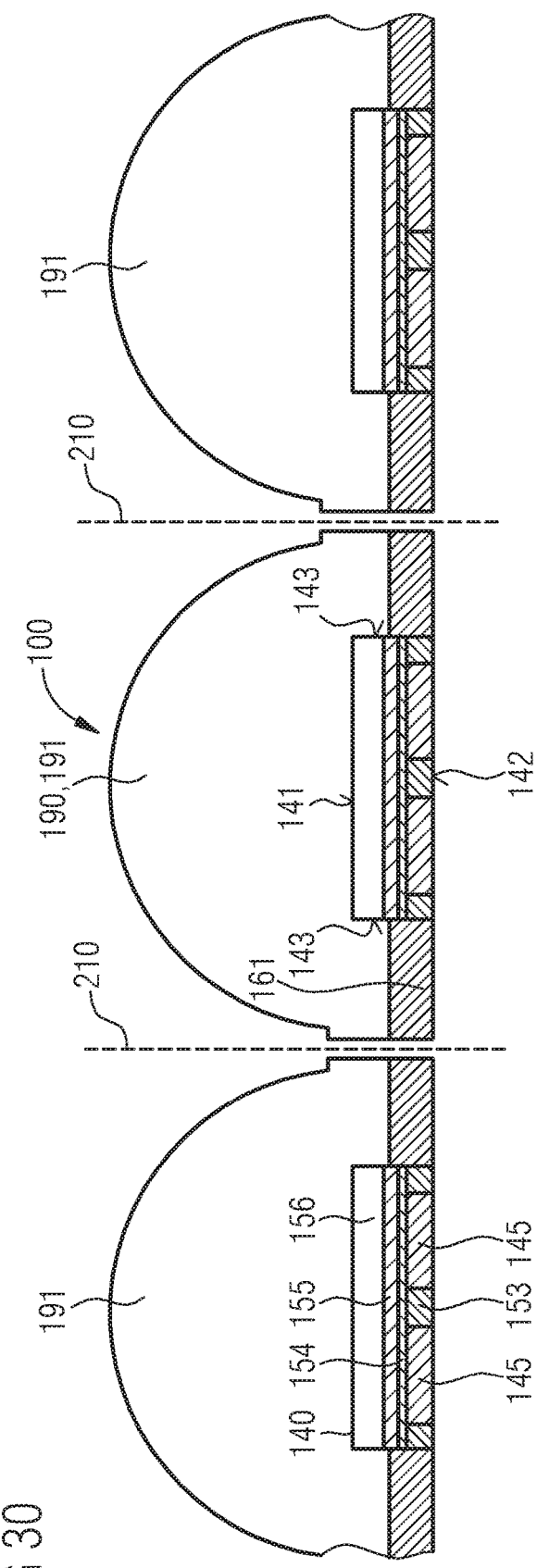

After that or after the layers 161, 191 have been cured, as is shown in FIG. 30, further method steps such as singulating the device assemblage into separate semiconductor devices 100 and removing the carrier 111 with the adhesive film 112 are carried out. The singulating may be carried out before removing the carrier 111. During the singulating, the lens layer 190 and the plastics layer 161 are severed laterally with respect to and between the semiconductor components 140 and also laterally with respect to and between the lenses 191 along separating lines 210, for example by means of sawing.

The semiconductor devices no produced with the aid of the method sequence in FIGS. 25 to 30 comprise a radiation-emitting semiconductor component 140 enclosed by a reflective plastics layer 161 and by a lens layer 190 comprising a lens 191. Beam shaping of the light radiation generated during operation may be achieved with the aid of the lens 190.

A further possible method variant consists in using a second layer as a sacrificial layer or sacrificial liquid and removing this layer again after centrifuging. Possible configurations are described in greater detail below. In this context, too, it is pointed out that corresponding method steps and features and also identical and identically acting components and layers will not be described in detail again below, and that for details in respect thereof reference is made to the description above.

Figure 31:
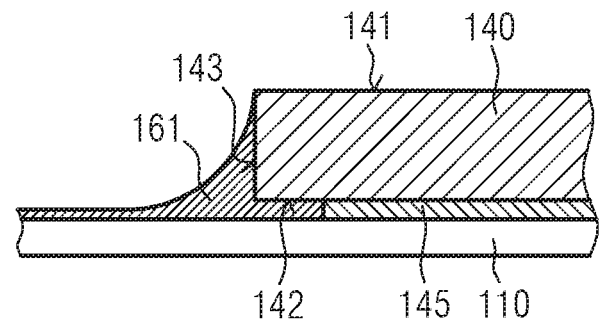
FIGS. 31 to 36 show a further method sequence for producing a semiconductor device, wherein a carrier with a semiconductor component is provided, a layer arrangement adjoining the semiconductor component and comprising a first layer comprising a curved layer surface and a second layer is provided on the carrier, centrifuging is carried out, curing the first layer is carried out, and removing the second layer and forming a further layer are carried out.

In order to illustrate the use of a sacrificial layer, FIGS. 31 to 36 show in an excerpt, on the basis of lateral sectional illustrations, a further method for producing a radiation-emitting semiconductor device 100. This method constitutes a modification of the method explained with reference to FIGS. 1 to 5. In the method, as is shown in FIG. 31, a carrier 110 with a radiation-emitting semiconductor component 140 arranged thereon is provided. It is possible for the carrier 110 to comprise a cavity or for a delimiting structure to be located on the carrier 110, within which delimiting structure the semiconductor component 140 is arranged (not illustrated). The semiconductor component 140 comprises the above-described construction comprising a front side 141, a rear side 142, one or more lateral sidewalls 143 and at least one rear-side contact 145. The semiconductor component 140 is configured for emitting radiation via the front side 141 and via the sidewalls 143.

In the method, a layer arrangement adjoining the semiconductor component 140 and laterally enclosing the semiconductor component 140 is subsequently provided on the carrier 110, the layer arrangement comprising a first and a second flowable layer 161, 262. As is shown in FIG. 31, firstly the flowable first layer 161 is formed on the carrier 110 laterally with respect to the semiconductor component 140. This is associated with a lateral wetting of the semiconductor component 140 with the first layer 161, such that the first layer 161 comprises a first configuration comprising a layer surface curved concavely in cross section and a nonuniform layer thickness profile laterally with respect to the semiconductor component 140. In this case, the semiconductor component 140 and thus its sidewalls 143 are enclosed laterally by the first layer 161. The first layer 161 extends as far as the front side 141 of the semiconductor component 140, the front side remaining uncovered. Furthermore, the layer 161 partly adjoins the rear side 142 of the semiconductor component 140 and the rear-side contact(s) 145, and is located in the interspace between the rear side 142 of the semiconductor component 140 and the carrier 110. The first layer 161 is a plastics layer comprising particles. The first layer 161 may be realized as described above, that is to say as a silicone layer comprising reflective particles.

Figure 32:
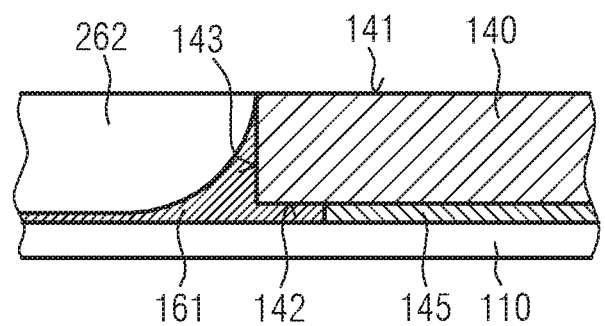

As is shown in FIG. 32, a flowable second layer 262 is subsequently formed on the still wet plastics layer 161 laterally with respect to the semiconductor component 140. The second layer 262 in the present case likewise extends as far as the uncovered front side 141 of the semiconductor component 140. In this case, the second layer 262 and thus the layer arrangement comprising the two layers 161, 262 terminates flush with the front side 141 of the semiconductor component 140. It is also possible to form the second layer 262 in such a way that the second layer 262 covers the front side 141 of the semiconductor component 140 (not illustrated).

The second layer 262, which is used as a sacrificial layer or sacrificial liquid and is removed again in a later method stage, is a particle-free layer. The second layer 262 comprises a flowable material. The latter may be a liquid. Examples of possible materials which may be considered for the second layer 262 are silicone oil, glycerol and/or water.

The second layer 262 comprises a lower density than the first layer 161. This may stem from the particle-comprising configuration of the first layer 161. Forming the two layers 161, 262 may be carried out in each case by applying the associated flowable layer material laterally with respect to the semiconductor component 140 with the aid of a dispenser (not illustrated).

Figure 33:
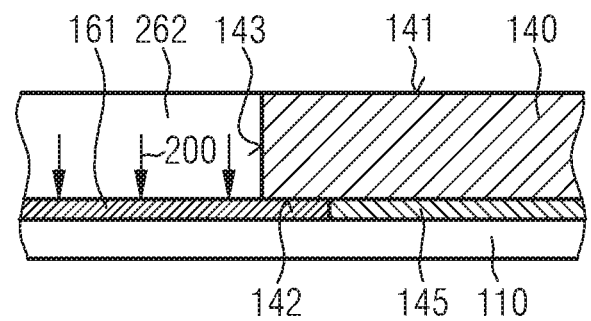

Afterward, centrifuging the carrier 110 provided with the semiconductor component 140 and the layer arrangement is carried out, as is shown in FIG. 33. In this case, the layer arrangement and thus also the heavier first layer 161, under the influence of the centrifugal force 200 are pressed in the direction of the carrier 110 with the consequence that the surface curvature of the first layer 161 and the lateral covering of the semiconductor component 140 with the layer 161 are at least reduced and, as a result, the layer 161 comprises a second configuration comprising a layer thickness profile made more uniform laterally with respect to the semiconductor component 140. As is shown in FIG. 33, what may be achieved as a result of the centrifuging is that the first layer 161 comprises a planar layer surface and a uniform layer thickness profile laterally with respect to the semiconductor component 140.

Furthermore, as is likewise shown in FIG. 33, the first layer 161 may no longer adjoin the sidewalls 143 of the semiconductor component 140, but instead only the rear side 142 and the rear-side contact(s) 145 of the semiconductor component 140 and may fill the interspace between the rear side 142 of the semiconductor component 140 and the carrier 110. For the case (not illustrated) in which the method is carried out with a larger amount of material of the first layer 161, in a departure from FIG. 33, the layer 161 may comprise a larger layer thickness laterally with respect to the semiconductor component 140, and the sidewalls 143 of the semiconductor component 140 may be covered partly or slightly with the layer 161.

Figure 34:
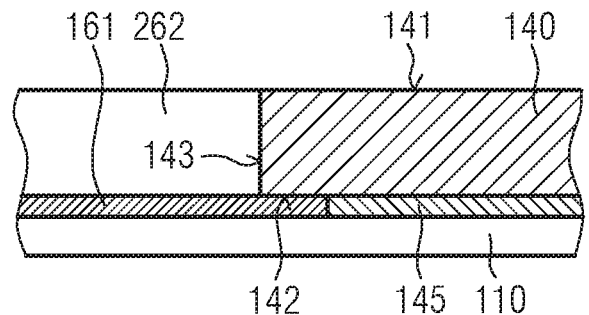

Intermixing of the two layers 161, 262 during the centrifuging is suppressed as a result of the greater density of the first layer 161. Consequently, the layers 161, 262 may be present as separate layers after the centrifuging as well. Furthermore, both layers 161, 262 are (still) in a wet or liquid and flowable state after the centrifuging. The second layer 262 arranged on the first layer 161 may ensure that reversion of the first layer 161 to the first, that is to say curved or more greatly curved, configuration is suppressed and, consequently, the second, that is to say less curved or, as shown in FIG. 34, planar, configuration of the layer 161 is maintained. This is because the surface tension of the first layer 161 may be neutralized with the aid of the second layer 262.

Figure 35:
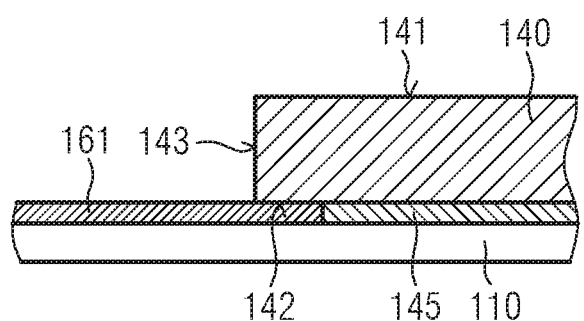

Afterward, curing only of the first layer 161 and, as is shown in FIG. 35, subsequent removing of the second layer 262 are carried out. The second layer 262 may be removed, for example, by using a solvent, or by evaporating the layer 262 by carrying out a heating process.

Curing the first layer 161 is carried out in such a way that in this process the second layer 262 is not influenced or impaired and the second layer 262 is neither cured nor removed during the curing of the first layer 161 and, consequently, the second layer 262 may still be present as a flowable layer after the curing of the first layer 161. In this way, it is possible to ensure that during the curing the first layer 161 maintains the second, that is to say less curved, as shown in FIGS. 34 and 35, planar, configuration. Furthermore, the second layer 262 may be reliably removed, without the cured first layer 161 being removed or damaged in the process.

The procedure mentioned above may be realized as follows. It is possible, for example, to carry out the process of curing the first layer 161 with the aid of a heating process. In a manner coordinated with this, the second layer 262 comprises a layer material that withstands the curing temperature used during the process of curing the first layer 161, with the result that curing or evaporation of the second layer 262 is avoided in this step. If the first layer 161 comprises a silicone material, the curing temperature of the first layer 161 may be in a temperature range of 80° C. to 150° C., for example. After that, the second layer 262 is removed, for example, by the second layer 262 being evaporated with the use of a higher temperature or be removed with the aid of a solvent.

Alternatively, there is the possibility of carrying out the process of curing the first layer 161 by means of irradiation with UV radiation. For this purpose, the first layer 161 may comprise a UV-curable plastics or silicone material. In a manner corresponding to this, the second layer 262 comprises a layer material which is not influenced by the UV radiation used and, consequently, no curing of the second layer 262 takes place. Afterward, the second layer 262 is removed, for example, by the use of a solvent or by evaporating the second layer 262 by carrying out a heating process.

Figure 36:
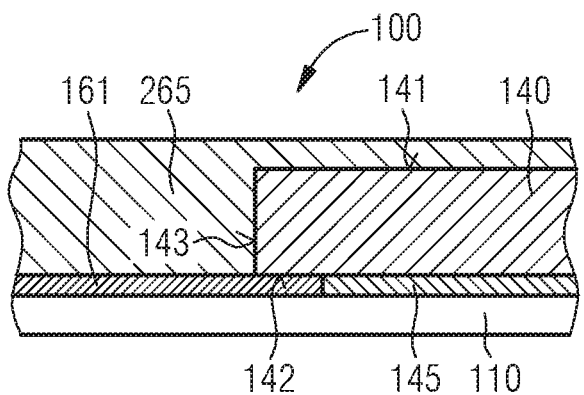

In order to complete the semiconductor device 100, at least one further process may subsequently be carried out. Forming a further layer 265 is possible, for example, with which the cured layer 161 and the semiconductor component 140 may be covered, as is shown in FIG. 36. The layer 265 may, for example, be a radiation-transmissive plastics layer or a conversion layer and be formed by applying a flowable plastics or silicone material optionally comprising phosphor particles.

The semiconductor device 100 produced in this way comprises the carrier 110, on which are arranged the semiconductor component 140 and the particle-comprising plastics layer 161 located laterally with respect to the semiconductor component 140 and partly adjoining the semiconductor component 140 on the rear side. The semiconductor component 140 and the layer 161 are covered with the further layer 265. The layer 161, which may serve as a white reflector layer of the semiconductor device 100, is present as a thin layer comprising a flat layer surface. In this way, during operation of the semiconductor component 140, it is possible for radiation to be coupled out via the front side 141 and via the sidewalls 143. It is optionally conceivable to use the carrier 110 only temporarily in the production method. In such a case (not illustrated), the carrier 110 may be removed and, in a departure from FIG. 36, the semiconductor device 100 may be provided without a carrier 110.

For the method sequence explained with reference to FIGS. 31 to 36, in which method sequence a sacrificial layer 262 is used and this layer 262 is removed again after centrifuging and curing of a first layer 161, variants and modifications comparable to those explained above with reference to FIGS. 7 to 30 with regard to the method sequence shown in FIGS. 1 to 5 may be considered. In a corresponding manner, therefore, it is possible, for example, to produce a plurality of semiconductor devices 100 jointly in an assemblage and then to singulate them, to use radiation-emitting CSP semiconductor components or semiconductor chips 140, to form sedimented conversion layers 171, to use carriers no comprising cavities 131, 181, in which semiconductor components 140 are arranged and separate layer arrangements adjoining the semiconductor components 140 and comprising a first layer 161 and a second layer 262 are formed, to provide a layer arrangement comprising a first layer 161 and a second layer 262 in a manner adjoining a plurality of semiconductor components 140 on a carrier 110, to form a lens layer 191, etc. For exemplary illustration, a further method sequence is described below with reference to FIGS. 37 to 42, which further method sequence constitutes a modification of the method sequence explained with reference to FIGS. 12 to 18.

Figure 37:
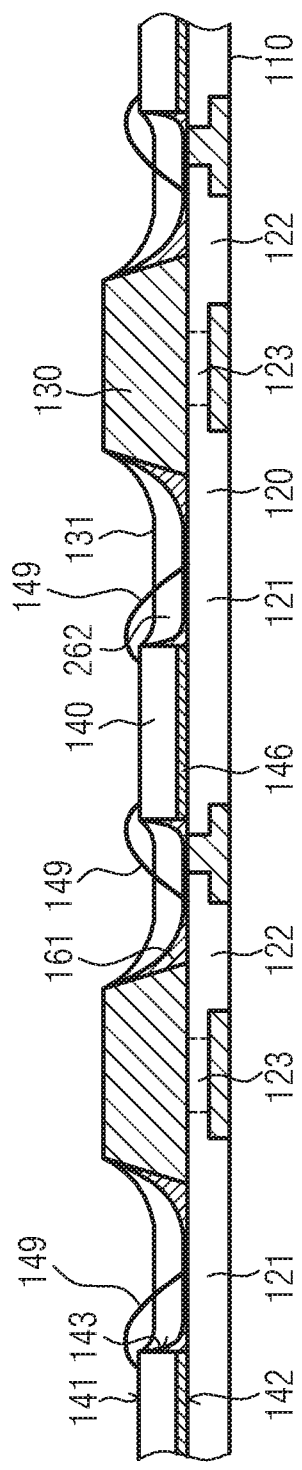

FIGS. 37 to 42 show in an excerpt, on the basis of lateral sectional illustrations, a further method for jointly producing radiation-emitting semiconductor devices 100. In the method, as is illustrated in FIG. 37, a carrier 110 with a plurality of radiation-emitting semiconductor components 140 arranged thereon is provided. The semiconductor components 140 are radiation-emitting semiconductor chips 140 in the form of volume emitting LED chips which comprise a rear-side metallization serving as a base 146 and to which bond wires 149 are connected. The carrier 110 is a leadframe-based carrier 110 comprising cavities 131, in each of which one of the semiconductor components 140 is arranged. The carrier 110 comprises a metallic leadframe 120 comprising leadframe sections 121, 122 and connecting structures 123, and a plastics body 130. For further details in respect thereof, reference is made to the description above.

Afterward, separate layer arrangements adjoining the semiconductor chips 140 and laterally enclosing the semiconductor chips 140 are provided in the cavities 131 of the carrier 110, as is shown in FIG. 37. For this purpose, firstly flowable first layers 161 are formed laterally with respect to the semiconductor chips 140 in the cavities 131. In this case, a lateral wetting of the semiconductor chips 140 takes place, such that the first layers 161 comprise a first configuration comprising a layer surface curved concavely in cross section and a nonuniform layer thickness profile laterally with respect to the semiconductor chips 140. The layers 161 extend as far as the front sides 141 of the semiconductor chips 140. A lateral wetting with the layers 161 furthermore takes place at the inner walls of the cavities 131, such that the layers 161 comprise a concavely curved layer surface in these regions as well. Furthermore, the layers 161 extend as far as the front side of the plastics body 130. The layers 161 are plastics layers comprising reflective particles.

Afterward, as is likewise illustrated in FIG. 37, flowable particle-free second layers 262 are formed in the cavities 131 of the carrier 110 laterally with respect to the semiconductor chips 140 on the still wet flowable first layers 161. This is done in such a way that the second layers 262 also extend as far as the front sides 141 of the semiconductor chips 140. Moreover, the layers 262, serving as sacrificial layer or sacrificial liquid, may extend as far as the front side of the plastics body 130. In this case, the layers 262 may comprise a concavely curved layer surface laterally with respect to the semiconductor chips 140 and laterally with respect to the inner walls of the cavities 131.

Figure 38:
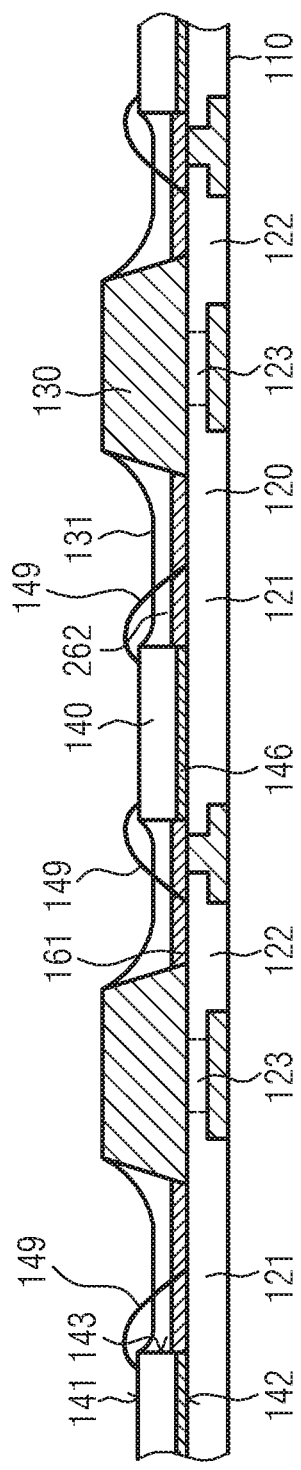

Centrifuging the carrier 110 provided with the semiconductor chips 140 and the layer arrangements is subsequently carried out in order at least to reduce the surface curvature of the first layers 161 laterally with respect to the semiconductor chips 140 and the lateral covering of the semiconductor chips 140 with the layers 161. As is shown in FIG. 38, what may be achieved as a result of the centrifuging is that the first layers 161 comprise a second configuration comprising a planar layer surface and a uniform layer thickness profile laterally with respect to the semiconductor chips 140 and laterally with respect to the inner walls of the cavities 131. The sidewalls 143 of the semiconductor chips 140 may be covered just slightly with the first layers 161. With the aid of the second layers 262, which may comprise a (more) planar manifestation (not illustrated) in the course of the centrifuging and may assume the configuration shown in FIG. 38 after the centrifuging, the state shown in FIG. 38 may be maintained.

Figure 39:
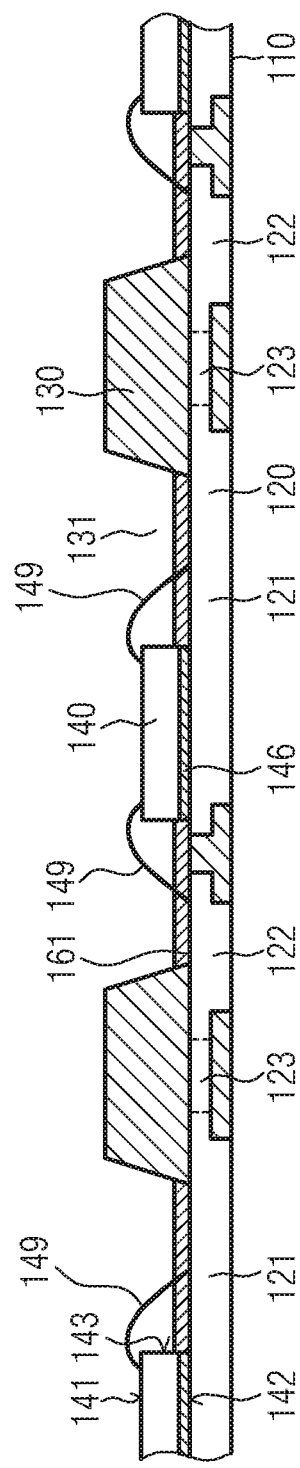

After that, curing of only the first layers 161 and, as is illustrated in FIG. 39, subsequent removing of the second layers 262 are carried out. The procedure as described above may be implemented for this purpose. Curing the first layers 161 may be carried out, for example, with the aid of a heating process or by means of irradiation with UV radiation. Removing the second layers 262 may be carried out by using a solvent or by evaporation in a heating process (carried out at a higher temperature).

Figure 40:
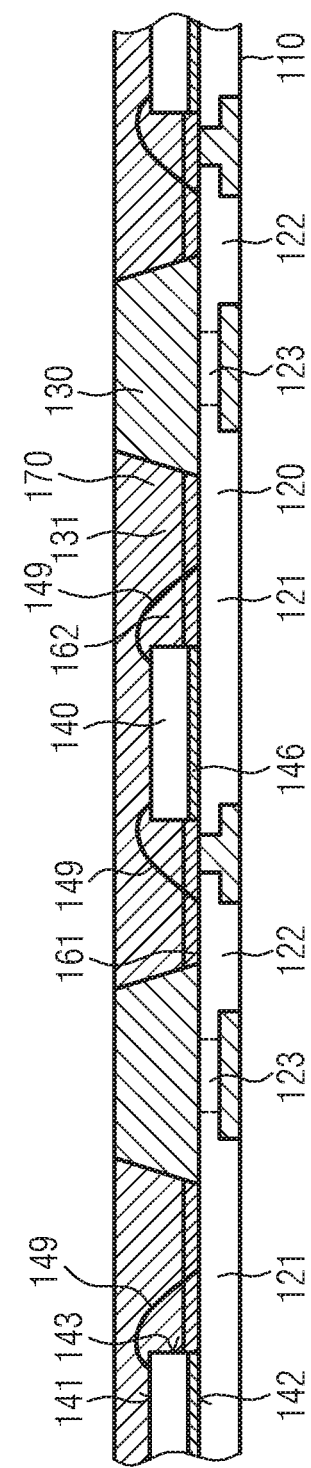

As is illustrated in FIG. 40, conversion layers 170 covering the semiconductor chips 140 and the cured layers 161 are subsequently formed in the cavities 131, the conversion layers terminating flush with the front side of the plastics body 130. For this purpose, a flowable plastics or silicone material comprising phosphor particles is introduced into the cavities 131. Sedimenting the phosphor particles is subsequently carried out. As a result, as is shown in FIG. 41, sedimented conversion layers 171 are formed on the semiconductor chips 140 and on the layers 161, each of which is covered by a further plastics layer 172.

Afterward or after a process of curing the layers 171, 172, as is illustrated in FIG. 42, singulating the device assemblage into separate semiconductor devices 100 is carried out. In this process, the carrier 110 is severed along separating lines 210. The semiconductor devices 100 produced with the aid of the method sequence in FIGS. 37 to 42 each comprise a part of the carrier 110 comprising a cavity 131, in which are arranged a semiconductor chip 140, a reflective plastics layer 161 laterally enclosing the semiconductor chip 140, a sedimented conversion layer 171 arranged on the plastics layer 161 and laterally enclosing the semiconductor chip 140 and covering the latter on the front side, and a radiation-transmissive plastics layer 172 covering the conversion layer 171.

Besides the embodiments described above and depicted in the figures, further embodiments are conceivable which may comprise further modifications and/or combinations of features.

With regard to combinations, there is the possibility, for example, of a process of forming a lens layer 190 by applying a radiation-transmissive plastics material comprising a structure comprising lenses 191 also being applied to the method sequences explained with reference to FIGS. 1 to 24 and 31 to 42. In this way, it is possible to produce the associated semiconductor devices boo with a lens 191.

Further modifications may consist in using other materials instead of the materials specified above. By way of example, other flowable plastics materials, for example, epoxy materials, may be employed instead of silicone materials. Furthermore, it is possible to use different plastics or silicone materials for a first and a second plastics layer 161, 162.

With regard to a first layer 161 comprising particles, other particles may be provided instead of reflective particles. For example, forming a first layer 161 comprising phosphor particles is possible. In this way, the first layer 161 may serve as a conversion layer of the associated semiconductor device 100.

A further example is forming a first layer 161 comprising absorbent particles. In this way, it is possible to achieve glare-free emission of radiation with a high contrast. On account of the absorbent particles, the first layer 161 may comprise a black color. The absorbent particles may be carbon black particles, for example.

Furthermore, additional particles may be provided in a first layer 161, which additional particles may be employed as a weight- and thus density-increasing filler in order to make available a difference in density, suitable for the centrifuging, between the first layer 161 and a second layer 162, 262. Such particles may be, for example, particles comprising a quartz material or a glass material. A configuration comprising further particles may be considered, for example, in the case of a first layer 161 comprising carbon black particles. Furthermore, glass fibers may be employed as a filler of a layer 161.

Further modifications may consist in using other carriers instead of the carriers mentioned. For example, the use of a ceramic carrier is possible. Besides a ceramic carrier material, such a carrier may comprise metallic conductor structures and optionally vias. A further example of a carrier is a metal core printed circuit board (MCPCB).

Although the invention has been more specifically illustrated and described in detail by means of preferred exemplary embodiments, nevertheless the invention is not restricted by the examples disclosed and other variations may be derived therefrom by the person skilled in the art, without departing from the scope of protection of the invention.

The invention claimed is:

1. A method for producing a semiconductor device, the method comprising:
providing a carrier with a semiconductor component arranged on the carrier;
providing a layer arrangement on the carrier, the layer arrangement adjoining the semiconductor component and comprising a first and a second flowable layer,
wherein the first layer is formed on the carrier and then the second layer is formed on the first layer,
wherein the first layer comprises particles,
wherein a density of the first layer is greater than a density of the second layer, and
wherein a lateral wetting of the semiconductor component with the first layer occurs such that the first layer comprises a first configuration comprising a curved layer surface laterally with respect to the semiconductor component; and
centrifuging the carrier, the semiconductor component and the layer arrangement such that a curvature of the layer surface of the first layer laterally with respect to the semiconductor component is at least reduced and the first layer comprises a second configuration as a result,
wherein the first layer cannot return to the first configuration since the second layer is arranged on the first layer.

2. The method according to claim 1, wherein the semiconductor component is one of the following: a radiation-emitting semiconductor component, a radiation-emitting semiconductor chip, or a radiation-emitting CSP semiconductor component.

3. The method according to claim 1, wherein the first and/or the second layer are/is a plastics layer.

4. The method according to claim 1, wherein the second layer is a radiation-transmissive plastics layer.

5. The method according to claim 1, wherein the first layer comprises at least the following particles: reflective particles, absorbent particles, and/or phosphor particles.

6. The method according to claim 1, wherein the first layer comprises particles with a proportion by weight in a range of 30% to 50%.

7. The method according to claim 1, further comprising, after centrifuging, curing the first layer and then removing the second layer.

8. The method according to claim 7, wherein the second layer comprises at least one of the following: silicone oil, glycerol; and/or water.

9. The method according to claim 1, wherein the first and second layers comprise a corresponding plastics material or the first and second layers comprise a silicone material.

10. The method according to claim 1, further comprising, after centrifuging, removing the carrier.

11. The method according to claim 1, wherein the carrier comprises a cavity in which the semiconductor component is arranged.

12. The method according to claim 1, wherein a wall structure enclosing a cavity is arranged on the carrier, and wherein the semiconductor component is arranged in the cavity.

13. The method according to claim 1, further comprising, after centrifuging:
    forming a further layer; or
    forming a lens.

14. The method according to claim 1, wherein the carrier is provided with a plurality of semiconductor components arranged on the carrier, and wherein the layer arrangement is provided in a manner adjoining the semiconductor components.

15. The method according to claim 1, wherein the carrier is provided with a plurality of semiconductor components arranged on the carrier, and wherein a plurality of separate layer arrangements adjoining semiconductor components and comprising the first and second layers are provided on the carrier.

16. The method according to claim 1, further comprising;
    producing a plurality of semiconductor devices jointly in an assemblage; and
    after centrifuging, singulating the assemblage into separate semiconductor devices.

17. A method for producing a semiconductor device, the method comprising:
    providing a carrier with a semiconductor component arranged on the carrier;
    providing a layer arrangement on the carrier, the layer arrangement adjoining the semiconductor component and comprising a first and a second flowable layer,
    wherein the first layer is formed on the carrier and then the second layer is formed on the first layer,
    wherein the first layer comprises particles,
    wherein a density of the first layer is greater than a density of the second layer, and
    wherein a lateral wetting of the semiconductor component with the first layer occurs such that the first layer comprises a first configuration comprising a curved layer surface laterally with respect to the semiconductor component;
    centrifuging the carrier, the semiconductor component and the layer arrangement such that a curvature of the layer surface of the first layer laterally with respect to the semiconductor component is at least reduced and the first layer comprises a second configuration as a result,
    wherein the first layer cannot return to the first configuration since the second layer is arranged on the first layer; and
    after centrifuging, curing the first layer and then removing the second layer, wherein curing the first layer is performed such that the second layer is neither cured nor removed while curing the first layer.

* * * * *